(12) United States Patent
Patel et al.

(10) Patent No.: US 9,594,098 B2
(45) Date of Patent: Mar. 14, 2017

(54) SYSTEMS AND METHODS FOR MEASURING ELECTRICAL POWER USAGE IN A STRUCTURE AND SYSTEMS AND METHODS OF CALIBRATING THE SAME

(71) Applicant: Belkin International, Inc., Playa Vista, CA (US)

(72) Inventors: Shwetak N. Patel, Seattle, WA (US); Sidhant Gupta, Seattle, WA (US); Matthew S. Reynolds, Seattle, WA (US); Karthik Yogeeswaran, Santa Monica, CA (US)

(73) Assignee: Belkin International Inc., Playa Vista, CA (US)

( * ) Notice: Subject to any disclaimer, the term of this patent is extended or adjusted under 35 U.S.C. 154(b) by 228 days.

(21) Appl. No.: 14/457,032

(22) Filed: Aug. 11, 2014

(65) Prior Publication Data

US 2014/0347039 A1    Nov. 27, 2014

Related U.S. Application Data

(60) Division of application No. 13/175,770, filed on Jul. 1, 2011, now Pat. No. 8,805,628, and a
(Continued)

(51) Int. Cl.
*G01R 19/00* (2006.01)
*G01R 15/20* (2006.01)
(Continued)

(52) U.S. Cl.
CPC ........... *G01R 19/0092* (2013.01); *G01R 1/20* (2013.01); *G01R 15/202* (2013.01);
(Continued)

(58) Field of Classification Search
CPC combination set(s) only.
See application file for complete search history.

(56) References Cited

U.S. PATENT DOCUMENTS 3,714,516 A    1/1973   Howe
4,612,617 A    9/1986   Laplace, Jr. et al.
(Continued)

FOREIGN PATENT DOCUMENTS

CN    1379860    11/2002
CN    1495432    5/2004
(Continued)

OTHER PUBLICATIONS

Arvola et al., "Billing Feedback as a Means to Encourage Household Electricity Conservation: A Field Experiment in Helsinki." Proceedings of the 1993 Summer Study of the European Council for Energy Efficient Economy: Nov. 21, 2003.
(Continued)

*Primary Examiner* — Clayton E Laballe
*Assistant Examiner* — Jas Sanghera
(74) *Attorney, Agent, or Firm* — Bryan Cave LLP

(57) ABSTRACT

A magnetic field sensing device can include two or more magnetic field sensors configured to detect a magnetic field in a current carrying conductor. The magnetic field sensing device also can include a phase detector electrically coupled to outputs of the two or more magnetic field sensors. The magnetic field sensing device further can include a phase indicator electrically coupled to the phase detector. The phase indictor can include a display that indicates when the two or more magnetic field sensors are in a position in relation to the current carrying conductor. Other embodiments are provided.

20 Claims, 15 Drawing Sheets

Related U.S. Application Data continuation-in-part of application No. 12/567,561, filed on Sep. 25, 2009, now Pat. No. 8,930,152.

(60) Provisional application No. 61/361,296, filed on Jul. 2, 2010, provisional application No. 61/380,174, filed on Sep. 3, 2010.

(51) Int. Cl.

| | | |
|---|---|---|
| *G01R 35/00* | (2006.01) | |
| *G01R 35/04* | (2006.01) | |
| *G01R 31/327* | (2006.01) | |
| *G01R 33/07* | (2006.01) | |
| *G01R 33/09* | (2006.01) | |
| *G01R 1/20* | (2006.01) | |
| G01R 21/00 | (2006.01) | |
| G01R 21/06 | (2006.01) | |
| G01R 22/06 | (2006.01) | |

(52) U.S. Cl.
CPC ......... *G01R 15/207* (2013.01); *G01R 31/327* (2013.01); *G01R 33/07* (2013.01); *G01R 33/09* (2013.01); *G01R 35/005* (2013.01); *G01R 35/007* (2013.01); *G01R 35/04* (2013.01); *G01R 21/001* (2013.01); *G01R 21/06* (2013.01); *G01R 22/06* (2013.01); *G01R 22/063* (2013.01)

(56) References Cited

U.S. PATENT DOCUMENTS

| | | | |
|---|---|---|---|
| 4,706,073 A | | 11/1987 | Vila Masot |
| 4,716,409 A | | 12/1987 | Hart et al. |
| 4,804,957 A | | 2/1989 | Selph et al. |
| 4,858,141 A | | 8/1989 | Hart et al. |
| 4,891,587 A | | 1/1990 | Squire |
| 5,229,753 A | | 7/1993 | Berg et al. |
| 5,233,342 A | | 8/1993 | Yashiro et al. |
| 5,268,666 A | | 12/1993 | Michel et al. |
| 5,276,629 A | | 1/1994 | Reynolds |
| 5,409,037 A | | 4/1995 | Wheeler et al. |
| 5,428,342 A | | 6/1995 | Enoki et al. |
| 5,441,070 A | | 8/1995 | Thompson |
| 5,467,011 A | * | 11/1995 | Hunt .................. G01R 29/18 324/107 |
| 5,483,153 A | | 1/1996 | Leeb et al. |
| 5,483,838 A | | 1/1996 | Holden |
| 5,534,663 A | | 7/1996 | Rivers et al. |
| 5,590,179 A | | 12/1996 | Shincovich et al. |
| 5,600,310 A | | 2/1997 | Whipple et al. |
| 5,635,895 A | | 6/1997 | Murr |
| 5,650,771 A | | 7/1997 | Lee |
| 5,699,276 A | | 12/1997 | Roos |
| 5,717,325 A | | 2/1998 | Leeb et al. |
| 5,808,846 A | | 9/1998 | Holce et al. |
| 5,880,677 A | | 3/1999 | Lestician |
| 5,898,387 A | | 4/1999 | Davis et al. |
| 6,094,043 A | | 7/2000 | Scott et al. |
| 6,147,484 A | | 11/2000 | Smith |
| 6,273,686 B1 | | 8/2001 | Kroell et al. |
| 6,275,168 B1 | | 8/2001 | Slater et al. |
| 6,330,516 B1 | | 12/2001 | Kammeter |
| 6,420,969 B1 | | 7/2002 | Campbell |
| 6,708,126 B2 | | 3/2004 | Culler et al. |
| 6,728,646 B2 | | 4/2004 | Howell et al. |
| 6,771,078 B1 | | 8/2004 | McCauley et al. |
| 6,816,078 B2 | | 11/2004 | Onoda et al. |
| 6,839,644 B1 | | 1/2005 | Bryant et al. |
| 6,853,291 B1 | | 2/2005 | Aisa |
| 6,860,288 B2 | | 3/2005 | Uhler |
| 6,906,617 B1 | | 6/2005 | Van de Meulen |
| 6,910,025 B2 | | 6/2005 | Cao |
| 6,949,921 B1 | | 9/2005 | Feight et al. |
| 6,993,417 B2 | | 1/2006 | Osann, Jr. |
| 7,019,666 B2 | | 3/2006 | Tootoonian Mashhad et al. |
| 7,043,380 B2 | | 5/2006 | Rodenberg et al. |
| 7,049,976 B2 | | 5/2006 | Hunt et al. |
| 7,119,533 B2 | | 10/2006 | Tamura et al. |
| 7,183,669 B2 | | 2/2007 | Schripsema et al. |
| 7,265,531 B2 | | 9/2007 | Stauth et al. |
| 7,276,915 B1 | | 10/2007 | Euler et al. |
| 7,298,133 B2 | | 11/2007 | Hastings et al. |
| 7,330,796 B2 | | 2/2008 | Addink et al. |
| 7,400,986 B2 | | 7/2008 | Latham et al. |
| 7,417,558 B2 | | 8/2008 | Lightbody et al. |
| 7,460,930 B1 | | 12/2008 | Howell et al. |
| 7,493,221 B2 | | 2/2009 | Caggiano et al. |
| 7,498,935 B2 | | 3/2009 | Kodama et al. |
| 7,508,318 B2 | | 3/2009 | Casella et al. |
| 7,511,229 B2 | | 3/2009 | Vlasak et al. |
| 7,541,941 B2 | | 6/2009 | Bogolea et al. |
| 7,546,214 B2 | | 6/2009 | Rivers, Jr. et al. |
| 7,656,649 B2 | | 2/2010 | Loy et al. |
| 7,693,670 B2 | | 4/2010 | Durling et al. |
| 7,719,257 B2 | | 5/2010 | Robarge et al. |
| 7,755,347 B1 | | 7/2010 | Cullen et al. |
| 7,804,280 B2 | | 9/2010 | Deaver, Sr. et al. |
| 7,855,655 B2 | | 12/2010 | Hunter et al. |
| 7,889,061 B2 | | 2/2011 | Endo |
| 7,912,530 B2 | | 3/2011 | Seki et al. |
| 7,996,171 B2 | | 8/2011 | Banhegyesi |
| 8,049,488 B2 | | 11/2011 | Dempster et al. |
| 8,065,099 B2 | | 11/2011 | Gibala et al. |
| 8,094,034 B2 | | 1/2012 | Patel et al. |
| 8,140,414 B2 | | 3/2012 | O'Neil et al. |
| 8,195,423 B2 | | 6/2012 | Von Zon |
| 8,344,724 B2 | | 1/2013 | Leeb et al. |
| 8,378,845 B2 | | 2/2013 | Reymann et al. |
| 8,392,107 B2 | | 3/2013 | Patel et al. |
| 8,463,452 B2 | | 6/2013 | Masters et al. |
| 8,494,762 B2 | | 7/2013 | Patel et al. |
| 8,659,286 B2 | | 2/2014 | Reynolds |
| 2001/0003286 A1 | | 6/2001 | Philippbar et al. |
| 2002/0036492 A1 | * | 3/2002 | Slater .................. G01R 21/133 324/142 |
| 2003/0088374 A1 | | 5/2003 | Slater et al. |
| 2003/0088527 A1 | | 5/2003 | Hung et al. |
| 2004/0128034 A1 | | 7/2004 | Lenker et al. |
| 2004/0140908 A1 | | 7/2004 | Gladwin et al. |
| 2004/0206405 A1 | | 10/2004 | Smith et al. |
| 2004/0251897 A1 | * | 12/2004 | Pedersen ................. G01R 33/04 324/253 |
| 2005/0067049 A1 | | 3/2005 | Fima |
| 2007/0064377 A1 | | 3/2007 | DeBoer et al. |
| 2007/0085534 A1 | * | 4/2007 | Seki ....................... G01R 33/02 324/248 |
| 2007/0132458 A1 | | 6/2007 | Allen |
| 2007/0230094 A1 | | 10/2007 | Carlson |
| 2008/0255782 A1 | | 10/2008 | Bilac et al. |
| 2009/0224754 A1 | | 9/2009 | Lamarre et al. |
| 2009/0312968 A1 | | 12/2009 | Phillips |
| 2010/0070214 A1 | | 3/2010 | Hyde et al. |
| 2010/0070218 A1 | | 3/2010 | Hyde et al. |
| 2010/0088057 A1 | | 4/2010 | Kopaczewski et al. |
| 2011/0004421 A1 | | 1/2011 | Rosewell et al. |
| 2011/0050218 A1 | | 3/2011 | Lohss |

FOREIGN PATENT DOCUMENTS

| | | |
|---|---|---|
| CN | 1509410 | 6/2004 |
| CN | 20121017 | 3/2009 |
| CN | 101523226 | 9/2009 |
| CN | 101562074 | 10/2009 |
| DE | 102007032053 | 1/2009 |
| EP | 200312 | 11/1986 |
| EP | 1136829 | 9/2001 |
| FR | 2645968 | 10/1990 |
| FR | 2680875 | 3/1993 |
| GB | 2228337 | 8/1990 |
| GB | 2235304 | 2/1991 |
| JP | 2001190506 | 7/1989 |
| JP | 2004296663 | 10/1992 |

(56) References Cited

FOREIGN PATENT DOCUMENTS

| JP | 2006062512 | 3/1994 |
|---|---|---|
| JP | 2009130961 | 5/1997 |
| JP | 10282161 | 10/1998 |
| JP | 2001103622 | 4/2001 |
| JP | 2005195427 | 7/2005 |
| JP | 2008122083 | 8/2006 |
| JP | 2007107972 | 4/2007 |
| JP | 2010112936 | 5/2010 |
| JP | 2010282161 | 12/2010 |
| KR | 20080114143 | 12/2008 |
| RU | 2200364 | 3/2003 |
| RU | 2402023 | 10/2010 |
| WO | 9304377 | 4/1993 |
| WO | 2008150458 | 12/2008 |
| WO | 2009081407 | 7/2009 |
| WO | 2010007369 | 1/2010 |
| WO | 2012003426 | 1/2012 |

OTHER PUBLICATIONS

Beckmann et al., "Some Assembly Required: Supporting End-User Sensor Installation in Domestic Ubiquitous Computing Environments." UbiComp 2004: 107-124, 2004.
Brandon et al., "Reducing Household Energy Consumption: A Qualitative and Quantitative Field Study." Journal of Environmental Psychology: 75-85, 1999.
Chetty et al., "Getting to Green: Understanding Resource Consumption in the Home." UbiComp 2008: 242-251, 2008.
Clifford et al., "A Retrofit 60 Hz Current Sensor for Non-Intrusive Power Monitoring at the Circuit Breaker." 8 pp., 2010.
Darby, Sarah., "Making it Obvious: Designing Feedback into Energy Consumption." Proceedings of the Second International Conference on Energy Efficiency in Household Appliances and Lighting: 11 pp., 2000.
Darby, Sarah., "The Effectiveness of Feedback on Energy Consumption: A Review for DEFRA on the Literature on Metering, Billing and Direct Displays." Environmental Change Institute: 21 pp., 2006.
Drenker et al., "Nonintrusive monitoring of electronic loads." IEEE pp. 47-51, Oct. 1999.
Fischer, Corinna., "Feedback on Household Electricity Consumption: A Tool for Saving Energy?" Energy Efficiency: 79-104, 2008.
Fitzpatrick et al., "Technology-Enabled Feedback on Domestic Energy Consumption: Articulating a Set of Design Concerns." PERVASIVEcomputing: 37-44, 2009.
Froehlich et al., "Sensing Opportunities for Personalized Feedback Technology to Reduce Consumption." UW CSE Technical Report: CSE Sep. 13, 2001: 7 pp., 2009.
Froehlich, Jon., "Sensing and Feedback of Everyday Activities to Promote Environmentally Sustainable Behaviors." Thesis Proposal, Computer Science and Engineering, University of Washington: 35 pp., 2009.
Hart, George W., Nonintrusive Appliance Load Monitoring. Proceedings of the IEEE, vol. 80, No. 12, Dec. 1992, pp. 1870-1891.
Hirsch et al., "The ELDer Project: Social, Emotional, and Environmental Factors in the Design of Eldercare Technologies." Conference on Universal Usability 2000: 72-79, 2000.
Horst, Gale., "Whirlpool Corporation: Woodridge Energy Study and Monitoring Pilot." 1-99, 2006.
Iachello et al., "Privacy and Proportionality: Adapting Legal Evaluation Techniques to Inform Design in Ubiquitous Computing." CHI 2005: 91-100, 2005.
Laughman et al., "Power Signature Analysis." IEEE Power and Engineering Magazine: 56-63, 2003.
Murata et al., "Estimation of Power Consumption for Household Electric Appliances." Proceedings of the 9th International Conference on Neural Information Processing: 2209-2303, 2002.
N.a., "End-User-Deployable Whole House Contact-Less Power Consumption Sensing." UbiComp 2009: 4 pp., 2009.
N.a. "Summary: The Impact of Real-Time Feedback on Residential Electricity Consumption: The Hydro One Pilot." 4 pp., 2006.
N.a., "The Value of Disaggregated Feedback." 1 pg., no date available.
Parker et al., "Contract Report: Pilot Evaluation of Energy Savings from Residential Energy Demand Feedback Devices." Florida Solar Energy Center, A Research Institute of the University of Central Florida: 32 pp., 2008.
Patel et al., "At the Flick of a Switch: Detecting and Classifying Unique Electrical Events on the Residential Power Line." UbiComp 2007: 271-288, 2007.
Patel et al., "Detecting Human Movement by Differential Air Pressure Sensing in HVAC System Ductwork: An Exploration in Infrastructure Mediated Sensing." Pervasive: 1-18, 2008.
Patel et al., "PowerLine Positioning: A Practical Sub-Room-Level Indoor Location System for Domestic Use." UbiComp 2006: 441-458, 2006.
Patel, Shwetak., "Bringing Sensing to the Masses: An Exploration in Infrastructure-Mediated Sensing." Intel Labs: 133 pp., 2008.
Prudenzi, A., "A Neuron Nets Based Procedure for Identifying Domestic Appliances Pattern-of-Use from Energy Recordings at Meter Panel." IEEE pp. 941-946.
Ramirez-Munoz et al., "Design and experimental verification of a smart sensor to measure the energy and power consumption in a one-phase AC line." Measurement vol. 42: 412-419, Aug. 2008.
Stuntebeck et al., "Wideband PowerLine Positioning for Indoor Localization." UbiComp 2008: 94-103, 2008.
Tapia et al."The Design of a Portable Kit of Wireless Sensors for Naturalistic Data Collection." Pervasive 2006 K.P. Fishkin et al. (Eds.): 117-134, 2006.
Ueno et al., "Effectiveness of Displaying Energy Consumption Data in Residential Houses—Analysis on how the Residents Respond." ECEEE 2005 Summer Study—What Works and Who Delivers?: 1289-1299, 2005.
Definition of "correlation", thefreedictionary.com, http://www.thefreedictionary.com/p/correlation, last accessed (Oct. 30, 2012).
Kientz et al., "The Georgia Tech Aware Home." CHI 2008: 3675-3680, 2008.
Mountain, Dean., "Price Influences Demand." DeGroote School of Business, McMaster University: 16 pp., 2008.
Wood et al., "Energy-use Information Transfer for Intelligent Homes: Enabling Energy Conservation with Central and Local Displays." Energy and Buildings, vol. 39: 495-503, 2007.
International Search Report and Written Opinion from corresponding Int'l Application No. PCT/US2011/042877, dated Dec. 27, 2011, ten (10) pages.
International Search Report and Written Opinion from corresponding Int'l Application No. PCT/US2011/042873, dated Dec. 26, 2011, ten (10) pages.
International Search Report and Written Opinion from corresponding Int'l Application No. PCT/US2010/043410, dated Feb. 28, 2011, ten (10) pages.
Warner, Hall-Effect Sensors Measure Up, ECN Magazine, http://www.ecnmag.com/print/articles/2009/03/sensor-zone-april-2009, Apr. 2009.
Formisano, Bob, How to Safely Turn Off Power at the Electrical Panel, http://homerepair.about.com/od/electricalrepair/ss/turn_off_main_elect_2.htm?p=1, (Picture from 2009), (last accessed Jun. 13, 2013).
Gupta, S., Reynolds, M.S., and Patel, S.N. ElectriSense: Single-Point Sensing Using EMI for Electrical Event Detection and Classification in the Home. In Proc. of UbiComp 2010.
Chen, J., Kam, A.H., Zhang, J., Liu, N., and Shue, L. Bathroom Activity Monitoring Based on Sound. (2005). In Pervasieve 2009, 47-61.
Cooley, J.J., Member, S., and Vickery, D. A Retrofit 60 Hz Current Sensor for Power Monitoring at the Circuit Breaker Panel, 2010.
Froehlich, J., Findlater, L., and Landay, J. The design of eco-feedback technology. In CHI 2010, 1999-2008.
Hart, G. Advances in nonintrusive appliance load monitoring. Proceedings of EPRI Information and Automation Coference, (1991).

(56) References Cited

OTHER PUBLICATIONS

Ho, B., Kao, N. C., Chen, N., et al. HeatProbe: A Thermal-based Power Meter for Accounting Disaggregated Electricity Usage. In UbiComp 2011.

Kawahara, Y., Hodges, S., Cook, B.S., and Abowd, G.D. Instant Inkjet Circuits: Lab-based Inkjet Printing to Support Rapid Prototyping of UbiComp Devices. In UbiComp 2013, 363-372.

Lorek, M.C., Chraim, F., Pister, K.S.J., and Lanzisera, S. Cots-based stick-on electricity meters for building submetering. 2013 Ieee Sensors, (2013), 1-4.

Patel, S.N., Gupta, S., and Reynolds, M.S. The design and evaluation of an end-user-deployable, whole house, contactless power consumption sensor. In CHI 2010.

Bin, S. and Dowlatabadi, H. Consumer lifestyle approach to US energy use and the related CO2 emissions. Energy Policy 33, 2 (2005), 197-208.

Froehlich, et. al., "Hydro-Sense: Infrastructure-Mediated Single-Point Sensing of Whole-Home Water Activity," In Proc. of UbiComp 2009, Sep.-Oct. 2009, pp. 235-244, Florida.

Mitchell, T., "Machine Learning," McGraw Hill, 1997.

International Search Report and Written Opinion for corresponding Int'l Application No. PCT/US11/033992 dated Dec. 26, 2011.

* cited by examiner

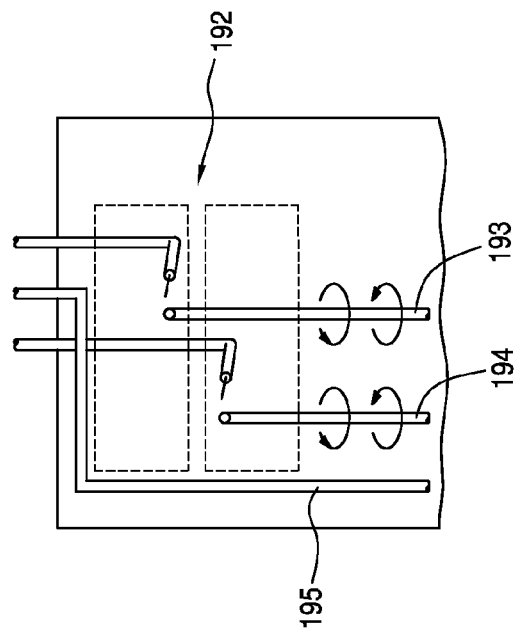
FIG. 5
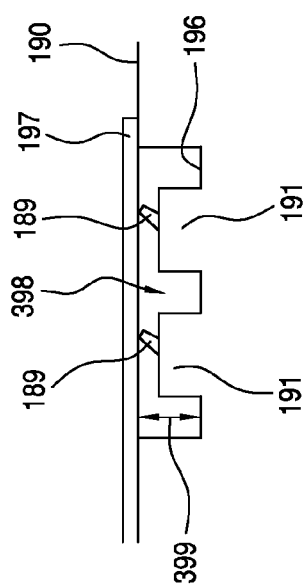
FIG. 3
FIG. 4

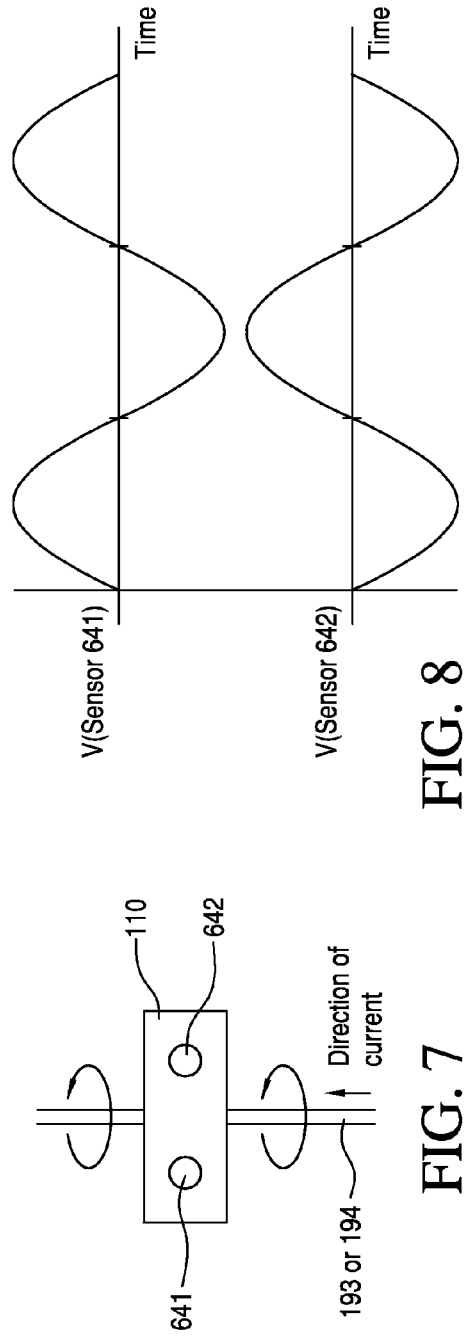
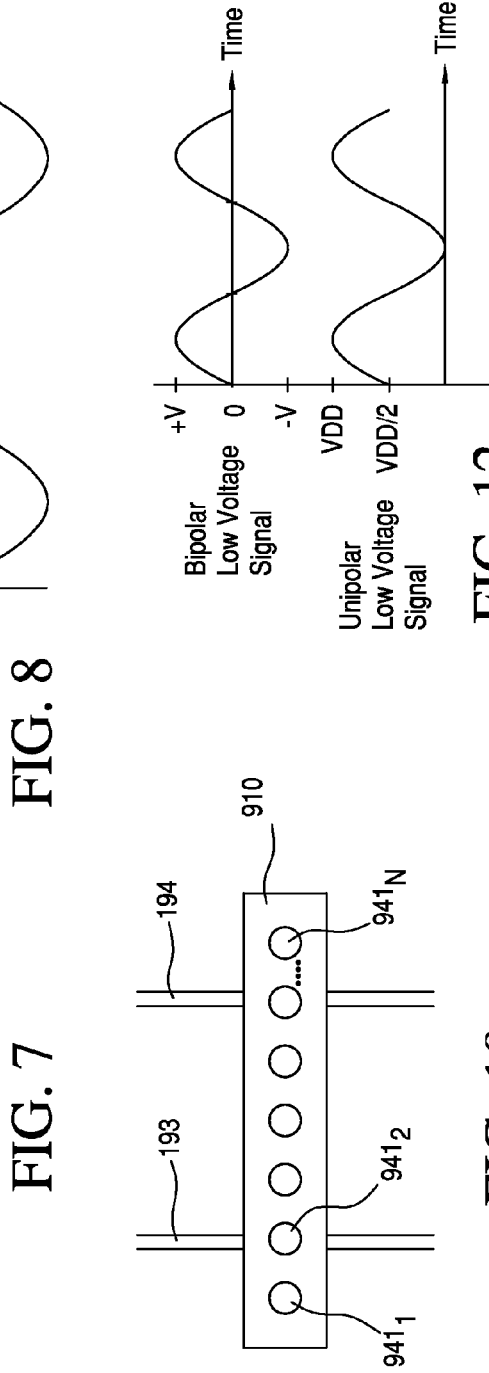

SYSTEMS AND METHODS FOR MEASURING ELECTRICAL POWER USAGE IN A STRUCTURE AND SYSTEMS AND METHODS OF CALIBRATING THE SAME

CROSS-REFERENCE TO RELATED APPLICATIONS

This application is a divisional of U.S. patent application Ser. No. 13/175,770, filed Jul. 1, 2011. U.S. patent application Ser. No. 13/175,770 claims the benefit of U.S. Provisional Application No. 61/361,296, filed Jul. 2, 2010, and U.S. Provisional Application No. 61/380,174, filed Sep. 3, 2010. U.S. patent application Ser. No. 13/175,770 is also a continuation-in-part of U.S. patent application Ser. No. 12/567,561, filed Sep. 25, 2009. U.S. Provisional Application Nos. 61/361,296 and 61/380,174 and U.S. patent application Ser. Nos. 13/175,770 and 12/567,561 are incorporated herein by reference in their entirety.

TECHNICAL FIELD

This disclosure relates generally to apparatuses, devices, systems, and methods for monitoring electrical power, and relates more particularly to such apparatuses, devices, systems, and methods that monitor electrical power in one or more main electrical power conductors at an electrical circuit breaker panel of a structure.

DESCRIPTION OF THE BACKGROUND

A structure (e.g., a home or a commercial building) can have one or more main electrical power conductors that supply the electrical power to electrical devices (i.e., the load) in the structure. Most structures use a split-phase electrical power distribution system with up to three main electrical power conductors. The main electrical power conductors enter the structure through an electrical circuit breaker panel. An electrical circuit breaker panel is the main electrical distribution point for electricity in a structure. Electrical circuit breaker panels also provide protection from over-currents that could cause a fire or damage electrical devices in the structure. Electrical circuit breaker panels can be coupled to and overlay at least part of the three main power conductors.

Different manufacturers of electrical circuit breaker panels, including, for example, Square-D, Eaton, Cutler-Hammer, General Electric, Siemens, and Murray, have chosen different conductor spacing and configurations for their electrical circuit breaker panels. Furthermore, each manufacturer produces many different configurations of electrical circuit breaker panels for indoor installation, outdoor installation, and for different total amperage ratings, of which 100 amperes (A) and 200 A services are the most common.

The different conductor layouts in the many different types of electrical circuit breaker panels result in different magnetic field profiles at the metal surfaces of the electrical circuit breaker panels. Moreover, the layout of the internal conductors (e.g., the main electrical power conductors) is not visible without opening the breaker panel and the manner in which the internal conductor layout translates into a magnetic field profile at the surface of the electrical circuit breaker panel requires a detailed knowledge of electromagnetic theory to interpret and model correctly. It is, therefore, difficult to measure accurately the magnetic field of the one or more main electrical power conductors at a surface of the electrical circuit breaker panel. If the magnetic field of the one or more main electrical power conductors at a surface of the electrical circuit breaker panel could be accurately determined, the electrical current and power being used by the load in the structure could be determined.

Accordingly, a need or potential for benefit exists for an apparatus, system, and/or method that allows a non-electrician to determine accurately the magnetic field and other parameters related to the one or more main electrical power conductors at the surface of the electrical circuit breaker panel.

BRIEF DESCRIPTION OF THE DRAWINGS

To facilitate further description of the embodiments, the following drawings are provided in which:

FIG. 3 illustrates a cut-away view of the circuit breaker panel of FIG. 1 along conductor 3-3, according to the first embodiment;

FIG. 4 illustrates an example of magnetic field conductors generated by a conductor;

FIG. 5 illustrates an example of the magnetic field conductors generated by main electrical power conductors in the circuit breaker of FIG. 1, according to the first embodiment;

FIG. 7 illustrates an exemplary placement of the sensing device of FIG. 2 over a main electrical power conductor of the circuit breaker of FIG. 1, according to the first embodiment;

FIG. 8 illustrates an exemplary graph of a voltage of electrical current sensors versus time, according to an embodiment;

FIG. 10 illustrates an example of the sensing device of FIG. 9 over the main electrical power conductors of the circuit breaker of FIG. 1, according to the second embodiment;

FIG. 12 illustrates exemplary graph of potential incoming low voltage signal to a controller of FIG. 11 from a level translator of FIG. 11, according to an embodiment;

Figure 1:
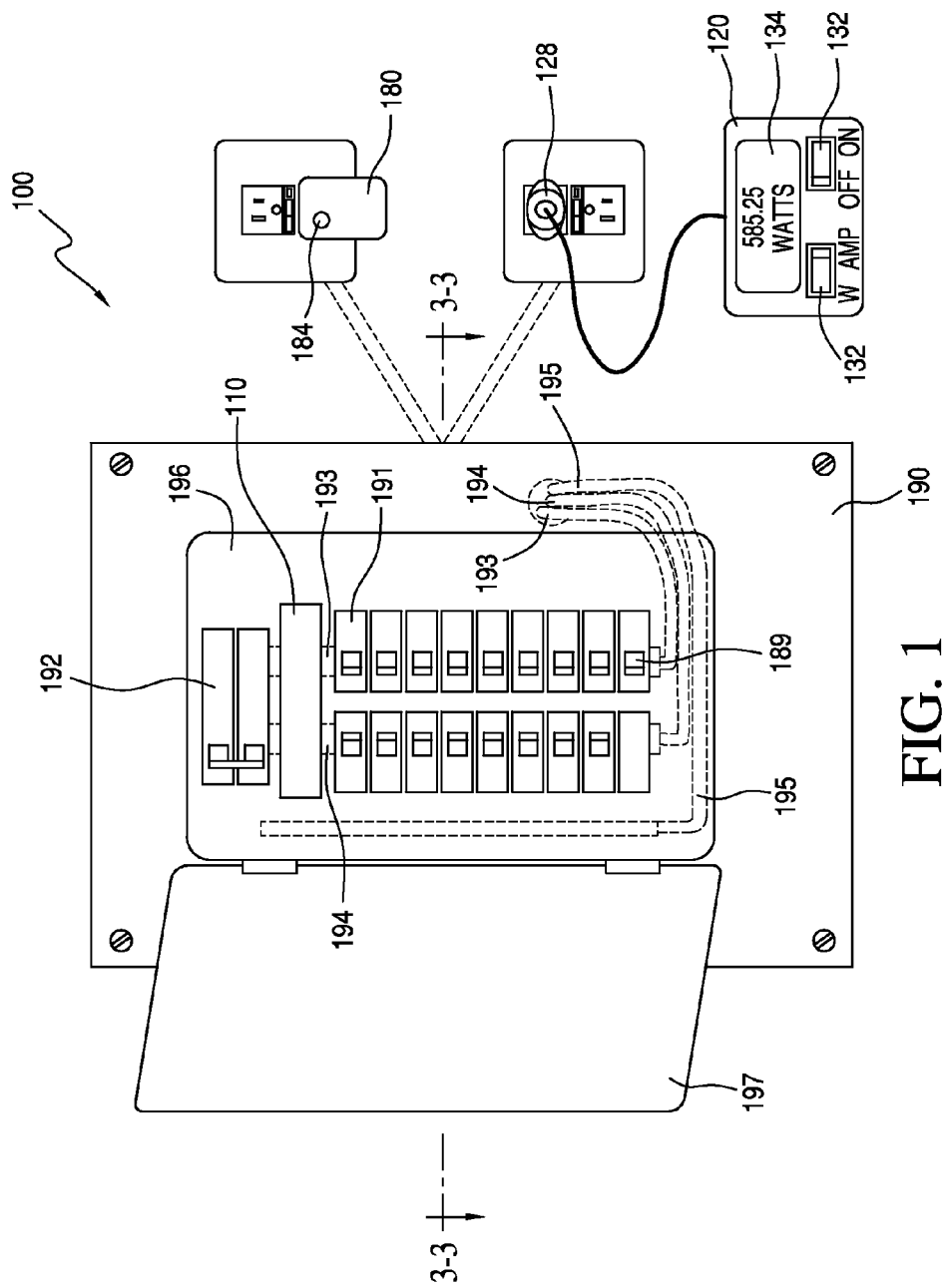
FIG. 1 illustrates a view of an exemplary electrical power monitoring system coupled to an electrical breaker panel, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

Detailed Description Of Examples Of Embodiments

Some embodiments can concern a method of using a power consumption measurement device. The power consumption measurement device can be mechanically coupled to a surface of a circuit breaker box overlying at least part of one or more main electrical supply conductors for an electrical power infrastructure of a structure. The method can include: determining one or more first magnetic field readings from the one or more main electrical supply conductors using one or more sensors in the power consumption measurement device; after determining the one or more first magnetic field readings, electrically coupling a first calibration load to the electrical power infrastructure; while the first calibration load remains electrically coupled to the electrical power infrastructure, determining one or more second magnetic field readings from the one or more main electrical supply conductors using the one or more sensors in the power consumption measurement device; calibrating the power consumption measurement device using at least in part the one or more first magnetic field readings and the one or more second magnetic field readings, after calibrating the power consumption measurement device, determining one or more third magnetic field readings from the one or more main electrical supply conductors using the one or more sensors in the power consumption measurement device; and determining an electrical power used by the electrical power infrastructure of the structure using at least the one or more third magnetic field readings and the one or more calibration coefficients. Calibrating the power consumption measurement device can include determining one or more first calibration coefficients for the power consumption measurement device using at least in part the one or more first magnetic field readings and the one or more second magnetic field reading.

Other embodiments can concern a method of calibrating a magnetic field sensor device. The magnetic field sensor device coupled to a first surface of a circuit breaker box. The circuit breaker box overlays an electrical power infrastructure of a building. The electrical power infrastructure has a first phase branch and a second phase branch. The magnetic field sensor device can include two or more magnetic field sensors. The method can include: determining a first amplitude and a first phase angle of a first magnetic field in the two or more magnetic field sensors of the magnetic field sensor device; receiving communications that a first load is coupled to the first phase branch of the electrical power infrastructure; while the first load is coupled to the first phase branch, determining a second amplitude and a second phase angle of a second magnetic field in the two or more magnetic field sensors of the magnetic field sensor device; receiving communications that a second load is coupled to the second phase branch of the electrical power infrastructure; while the second load is coupled to the first phase branch, determining a third amplitude and a third phase angle of a third magnetic field in the two or more magnetic field sensors of the magnetic field sensor device; and determining one or more calibration coefficients for the magnetic field sensor device at least in part using the first amplitude and the first phase angle of the first magnetic field in the two or more magnetic field sensors, the second amplitude and the second phase angle of the second magnetic field in the two or more magnetic field sensors, and the third amplitude and the third phase angle of the third magnetic field in the two or more magnetic field sensors.

Further embodiments can concern a system for monitoring electrical power usage in an electrical power infrastructure of a building. The building includes a circuit breaker box and electrical supply conductors of the electrical power infrastructure of the building. The system can include: (a) a power consumption measurement device configured to be coupled to a first surface of the circuit breaker box. the circuit breaker box overlying at least part of the electrical supply conductors for the electrical power infrastructure, the power consumption measurement device having one or more magnetic field sensors; (b) a first calibration device configured to be electrically coupled to the electrical power infrastructure, the first calibration module comprising one or more first calibration loads; and (c) a calibration module configured to run on a first processor and configured to at least partially calibrate the power consumption measurement device using data obtained from the one or more magnetic field sensors of the power consumption measurement device. The power consumption measurement device can be configured to obtain at least part of the data while at least one of the one or more first calibration loads is electrically coupled to the electrical power infrastructure and while the power consumption measurement device is coupled to the first surface of the circuit breaker box.

In yet still further embodiments, a magnetic field sensing device can include: (a) at least two magnetic field sensors configured to detect a magnetic field in a current carrying conductor; (b) a phase detector electrically coupled to outputs of the at least two magnetic field sensors; and (c) a phase indicator electrically coupled to the phase detector. The phase indictor can include a display that indicates when the at least two magnetic field sensors are in a predetermined position in relation to the current carrying conductor.

Additional embodiments can include a method of calibrating a magnetic field sensor device. The magnetic field sensor device can be coupled to a first surface of a circuit breaker box. The circuit breaker box can be overlying at least part of an electrical power infrastructure of a building. The electrical power infrastructure can have one or more main electrical supply conductors, a first phase branch, and a second phase branch. The magnetic field sensor device can include two or more magnetic field sensors. The method can include determining via the magnetic field sensor device a first amplitude and a first phase angle of a first magnetic field in the two or more magnetic field sensors of the magnetic field sensor device while the magnetic field sensor device is coupled to the first surface of the circuit breaker box. The method also can include, after a first load has been coupled to the first phase branch of the electrical power infrastructure, determining via the magnetic field sensor device, a second amplitude and a second phase angle of a second magnetic field in the two or more magnetic field sensors of the magnetic field sensor device while the magnetic field sensor device is coupled to the first surface of the circuit breaker box and while the first load is coupled to the first phase branch. The method further can include, after the first load has been uncoupled from the first phase branch of the electrical power infrastructure and a second load has been coupled to the second phase branch of the electrical power infrastructure, determining via the magnetic field sensor device, a third amplitude and a third phase angle of a third magnetic field in the two or more magnetic field sensors of the magnetic field sensor device while the magnetic field sensor device is coupled to the first surface of the circuit breaker box and while the second load is coupled to the second phase branch. The method also can include determining via a computer processor one or more calibration coefficients for the magnetic field sensor device at least in part using the first amplitude and the first phase angle of the first magnetic field in the two or more magnetic field sensors, the second amplitude and the second phase angle of the second magnetic field in the two or more magnetic field sensors, and the third amplitude and the third phase angle of the third magnetic field in the two or more magnetic field sensors. The magnetic field sensor device can be not electrically coupled in series with or physically coupled directly to the one or more main electrical supply conductors at the circuit breaker box when the magnetic field sensor device is coupled to the first surface of the circuit breaker box.

Further embodiments can include a magnetic field sensing device. The magnetic field sensing device can include two or more magnetic field sensors configured to detect a magnetic field in a current carrying conductor. The magnetic field sensing device also can include a phase detector electrically coupled to outputs of the two or more magnetic field sensors. The magnetic field sensing device further can include a phase indicator electrically coupled to the phase detector. The phase indictor can include a display that indicates when the two or more magnetic field sensors are in a predefined position in relation to the current carrying conductor.

Yet further embodiments can include method of providing a magnetic field sensing device. The method can include providing two or more magnetic field sensors configured to detect a magnetic field in a current carrying conductor. The method also can include providing a phase detector electrically coupled to outputs of the two or more magnetic field sensors. The method further can include providing a phase indicator electrically coupled to the phase detector. The phase indictor can include a display that indicates when the two or more magnetic field sensors are in a predefined position in relation to the current carrying conductor.

Figure 2:
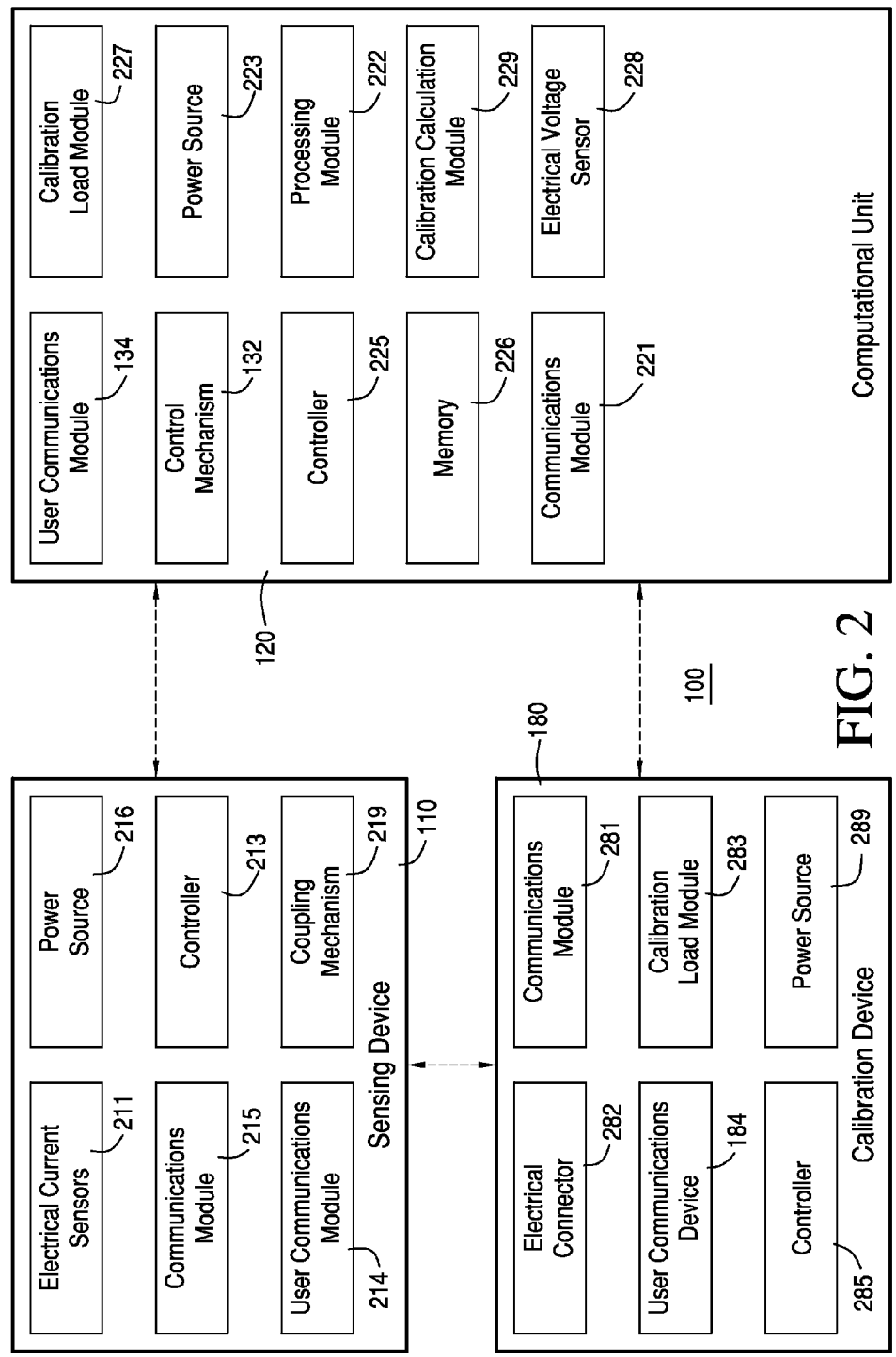
FIG. 2 illustrates a block diagram of the electrical power monitoring system of FIG. 1, according to the first embodiment.

FIG. 1 illustrates a view of an exemplary electrical power monitoring system 100 coupled to a circuit breaker panel 190, according to a first embodiment. FIG. 2 illustrates a block diagram of electrical power monitoring system 100, according to the first embodiment. FIG. 3 illustrates a cut-away view of circuit breaker panel 190 along conductor 3-3, according to the first embodiment.

Electrical power monitoring system 100 can also be considered a system for monitoring electrical power usage of a structure (i.e., a building). Electrical power monitoring system 100 can also be considered a device and system for determining the predicted current used by one or more electrical device (i.e., the load) in a structure. Electrical power monitoring system 100 is merely exemplary and is not limited to the embodiments presented herein. Electrical power monitoring system 100 can be employed in many different embodiments or examples not specifically depicted or described herein.

In some examples, electrical power monitoring system 100 can include: (a) at least one sensing device 110 (i.e., a power consumption measurement device); (b) at least one computational unit 120; and (c) at least one calibration device 180.

In some examples, system 100 can be used on breaker panels from different manufacturers and on different types of breaker panels from the same manufacturer. In addition, in some examples, system 100 can be easily installed by an untrained person (i.e., a non-electrician) without opening the breaker panel box and exposing the uninsulated electrical power conductors inside.

Also as shown in FIG. 1, a conventional breaker box or circuit breaker panel 190 can include: (a) two or more individual circuit breakers 191; (b) two or main circuit breakers 192; (c) a panel 196 with an exterior surface; and (d) a door 197 that provides access to circuit breakers 191 and 192. At least a portion of main electrical power conductors 193, 194, and 195 can be located within circuit breaker panel 190. "Circuit breaker panel" can also refer to and include fuse boxes, which are still common in buildings with older electrical systems. The electrical power infrastructure of a structure can include at least circuit breaker panel 190 and main electrical power conductors 193, 194, and 195. In some examples, circuit breaker panels can also refer to any type of electrical distribution panel used to provide electricity to a structure.

Main electrical power conductors 193, 194, and 195 are electrically coupled to main circuit breakers 192 and supply the electrical power to electrical devices (i.e., the load) in the structure. Panel 196 overlies at least part of main electrical power conductors 193, 194, and 195 and associated circuitry to protect people from inadvertently contacting these energized electrical power conductors. Usually, panel 196 is composed of steel or another metal.

Door 197 covers circuit breakers 191 and 192 and is typically closed for aesthetic reasons but can be opened to allow access to the levers of the circuit breakers 191 and 192 within circuit breaker panel 190. As shown in FIG. 3, when door 197 is closed, panel region 398 can have a panel region depth 399. The panel region depth 399 is typically 13 millimeters (mm) to 20 mm to allow door 197 to close without hitting the circuit breaker levers 189. The depth of panel region depth 399 limits the permissible thickness of sensing device 110 that is mounted in panel region 398. That is, in various examples, sensing device 110 can fit within panel region depth 399 so that the door of the breaker panel can be kept closed while sensing device 110 is in operation. In many examples, sensing device 110 has a depth of less than 20 mm. In the same or different examples, sensing device 110 can have a depth of less than 13 mm.

Residential and small commercial electrical service is typically 240 volt split phase service. This refers to the utility providing two 120 V alternating current (AC) source conductors (e.g., power conductors 193 and 194) that are 180 degrees out of phase, along with a neutral conductor (e.g., power conductor 195) that can be used to return current from either power conductor 193 or 194. Power conductors 193, 194, and 195 are the "feeder" or "main" electrical power conductors that carry the incoming power from the utility before being split up into branch circuits that serve different loads. By sensing the magnetic fields generated by power conductors 193, 194, and 195, system 100 can sense the total current drawn by all loads from the utility because all loads in the structure are coupled in parallel to power conductors 193, 194, and/or 195.

In the United States, many different types of electrical loads are found in a building served by a 240 V split phase utility service. The electrical loads can be divided into two categories of loads: (a) 120 V loads; and (b) 240 V loads.

The 120 V loads can primarily include lower-wattage loads, i.e., loads plugged into standard 3-prong 120 V 15 A or 120 V 20 A outlets, and small appliances with less than ~2 kW (kilowatt) power draw. These loads are wired in individual circuits between power conductors 193 and 195 pair (the "first phase branch" or the "193-195 leg" of the wiring circuit) or power conductors 194 and 195 pair (the "second phase branch" or the "194-195 leg" of the wiring circuit). When wiring a structure, electricians attempt to balance the anticipated wattage of loads and outlets on each leg, but this is not an exact process so current in the 193-195 leg and the 194-195 leg are likely to be unbalanced because a different total wattage is typically drawn from each pair. When a 120 V load is turned on, its current flows from the utility, through power conductor 193 or 194 through the main and circuit level circuit breakers, to the load, and then back to power conductor 195 and back to the utility.

The 240 V loads are typically large appliances (e.g., electric dryer, stove, air conditioner compressor, electric baseboard heaters) that consume more than two kW (kilowatts). In this case, the load current flows between power conductors 193 and 194 and no load current flows in power conductor 195. Because of the 180 degree phase relationship between the voltages on power conductors 193 and 194, the total voltage is 240 V.

Referring again to FIGS. 1 and 2, computational unit 120 can include: (a) a communications module 221; (b) a processing module 222; (c) a power source 223 with an electrical connector 128; (d) a user communications device 134; (e) a controller 225; (f) memory 226; (g) a calibration load module 227; (h) a calibration calculation module 229; (i) a control mechanism 132; and (j) electrical voltage sensor 228.

Computational unit 120 can be configured to receive the output signal from calibration device 180 and/or sensing device 110 via communications module 221 and process the output signal to determine one or more parameters related to the electrical power usage of the structure (e.g., the electrical power used by the structure and the electrical current in main electrical power conductors 193, 194, and 195). In some embodiments, computational unit 120 can be a personal computer (PC).

Controller 225 can be a microcontroller such as the MSP430 microcontroller manufactured by Texas Instruments, Inc. In another embodiment, controller 225 is a digital signal processor such as the TMS320VC5505 digital signal processor manufactured by Texas Instruments, Inc. or a Blackfin digital signal processor manufactured by Analog Devices, Inc.

Processing module 222 can be configured use current measurements from sensing device 110 to determine one or more parameters related to the electrical power usage of the structure (e.g., the electrical current and electrical power of main electrical power conductors 193, 194, and 195). As will be explained below, calibration calculation module 229 can be configured to use current measurements from sensing device 110 to calibrate electrical power monitoring system 100 (e.g., calculate the calibration coefficients for sensing device 110).

In some examples, processing module 222 and calibration calculation module 229 can be stored in memory 226 and configured to run on controller 225. When computational unit 120 is running, program instructions (e.g., processing module 222 and/or calibration calculation module 229) stored in memory 226 are executed by controller 225. A portion of the program instructions, stored in memory 226, can be suitable for carrying out methods 1800 and 2000 (FIGS. 18 and 20, respectively) as described below.

Calibration load module 227 can include one or more calibration loads. As will be explained below, the one or more calibration loads can be temporarily electrically coupled to, for example, the first phase branch of the electrical power infrastructure of structure to help calibrate electrical power monitoring system 100.

In some examples, user communications device 134 and control mechanism 132 can be detachable from the rest of computational unit 120 and wirelessly communicate with the rest of computational unit 120.

Electrical voltage sensor 228 can be used to determine the amplitude and phase angle of the voltage across the electrical power infrastructure. The phase angle of the current across is equal to the phase angle measured by electrical current sensors 211 minus the phase angle of the voltage measured using electrical voltage sensor 228. That is, the phase angle of the current can be calculated in reference to the zero point crossing of the voltage.

In some examples, sensing device 110 can communicate the current measurement made by electrical current sensors 211 to computation unit 120 so the phase angle of the current can be calculated. In other examples, computational device 120 can communicate the voltage measurement by electrical voltage sensor 228 to sensing device 110 so the phase angle of the current can be calculated. In other examples, electrical voltage sensor 228 can be located in calibration device 180.

Power source 223 can provide electrical power to communications module 221, a processing module 222, user communications device 134, controller 225, memory 226, calibration load module 227, and/or control mechanism 132. In some examples, power source 223 can coupled to electrical connector 128 that can be coupled to an electrical wall outlet of the electrical power infrastructure.

User communications device 134 can be configured to display information to a user. In one example, user communications device 134 can be a monitor, a touch screen, and/or one or more LEDs (light emitting diodes).

Control mechanism 132 can include one or more buttons configured to at least partially control computational unit 120 or at least user communications device 134. In one example, control mechanism 132 can include a power switch (i.e., an on/off switch) and/or a display switch configured to control what is displayed on user communications device 134.

Still referring to FIGS. 1 and 2, sensing device 110 can include: (a) two or more or magnetic field sensors or electrical current sensors 211; (b) a controller 213; (c) a user communications module 214; (d) a communications module 215; (e) a power source 216; and (f) a coupling mechanism 219. Controller 213 can be used to control electrical current sensors 211, user communications module 214, communications module 215, and power source 216.

Electrical current sensors 211 can include an inductive pickup, a Hall effect sensor, a magnetoresistive sensor, or any other type of sensor configured to respond to the time varying magnetic field produced by the conductors inside circuit breaker panel 190.

In various examples, sensing device 110 can be configured to be coupled to a surface of panel 196 using coupling mechanism 219. In some examples, coupling mechanism 219 can include an adhesive, a Velcro® material, a magnet, or another attachment mechanism.

Communications module 215 can be electrically coupled to electrical current sensors 211 and controller 213. In some examples, communications module 215 communicates the voltages or other parameters measured using electrical current sensors 211 to communications module 221 of computational unit 120. In many examples, communications module 215 and communications module 221 can be wireless transceivers. In some examples, electrical signals can be transmitted using WI-FI (wireless fidelity), the IEEE (Institute of Electrical and Electronics Engineers) 802.11 wireless protocol or the Bluetooth 3.0+HS (High Speed) wireless protocol. In further examples, these signals can be transmitted via a Zigbee (IEEE 802.15.4 wireless protocol), Z-Wave, or a proprietary wireless standard. In other examples, communications module 215 and communications module 221 can communicate electrical signals using a cellular or wired connection.

User communications module 214 can be configured to display information to a user. In one example, user communications module 214 can be a LCD (liquid crystal display), and/or one or more LEDs (light emitting diodes).

Controller 213 can be configured to control electrical current sensors 211, communications module 215, user communications module 214, and/or power source 216.

Calibration device 180 can include: (a) a communications module 281; (b) an electrical connector 282; (c) a calibration load module 283; (d) a user communication device 184; (e) a controller 285; and (f) a power source 289. In some examples, communications module 281 can be similar or the same as communications module 215 and/or 221. Electrical connector 282 can be an electrical power plug in some examples. User communication device 184 can be configured to display information to a user. In one example, user communication device 184 can be one or more LEDs.

According to Ampere's Law, magnetic fields are generated by current carrying conductors, as shown in FIG. 4. That is, the magnetic field generated by a given conductor is a three-dimensional vector field, which can be decomposed into components in each of the X, Y, and Z axes. In an alternating current system, these magnetic fields are time varying in magnitude, but maintain the same vector angle with respect to the coordinate basis. Thus, when referring to the X axis, for example, the field may at any instant be pointing in the +X direction or the −X direction as the AC current reverses direction at the line frequency of, for example, 60 Hz. It is intended that a magnetic field component in the X direction may refer to either +X or −X depending on the direction of current flow at a particular instant.

The magnetic field lines obey the "right hand rule" of Ampere's law; if the thumb of a person's right hand is aligned with the direction of current flow in the conductor, the field lines wrap around the conductor perpendicular to that conductor and in the direction of the person's fingers.

Some embodiments are primarily concerned with the magnetic field component that is oriented perpendicular to the plane of the circuit breaker panel (along the "Z" axis) because these are the field components that can be easily sensed by a magnetic field sensor (i.e., sensing device 110) outside the metal cover of circuit breaker panel 190.

As shown in FIG. 5, because power conductors 193 and 194 have a 180 degree phase difference, at any moment in time, the direction of the magnetic field lines loop in opposite directions.

Thus, according to Kirchhoff's Current Law, the total current through a given feed conductor (i.e., power conductors 193, 194, and/or 195) is the sum of all of the load currents drawn from that conductor. The magnitude of the magnetic field generated by each of the conductors (i.e., power conductor 193, 194, or 195) is therefore directly proportional to the sum of the currents drawn on all branch circuits connected to that conductor. The direction of the magnetic field lines from a given conductor does not change as the currents on the branches.

System 100 can be configured to sense the magnetic fields generated by at least power conductors 193 and 194 in order to address the three possible load cases: (a) 120 V load between the 193-195 leg, (b) 120 V load between the 194-195 leg, and (c) 240 V load between 193-194 leg. In most cases it is not necessary to sense the magnetic field generated by the power conductor 195 (i.e., the neutral conductor) because any current drawn through power conductor 195 is either sourced by power conductor 193 or 194.

Figure 6:
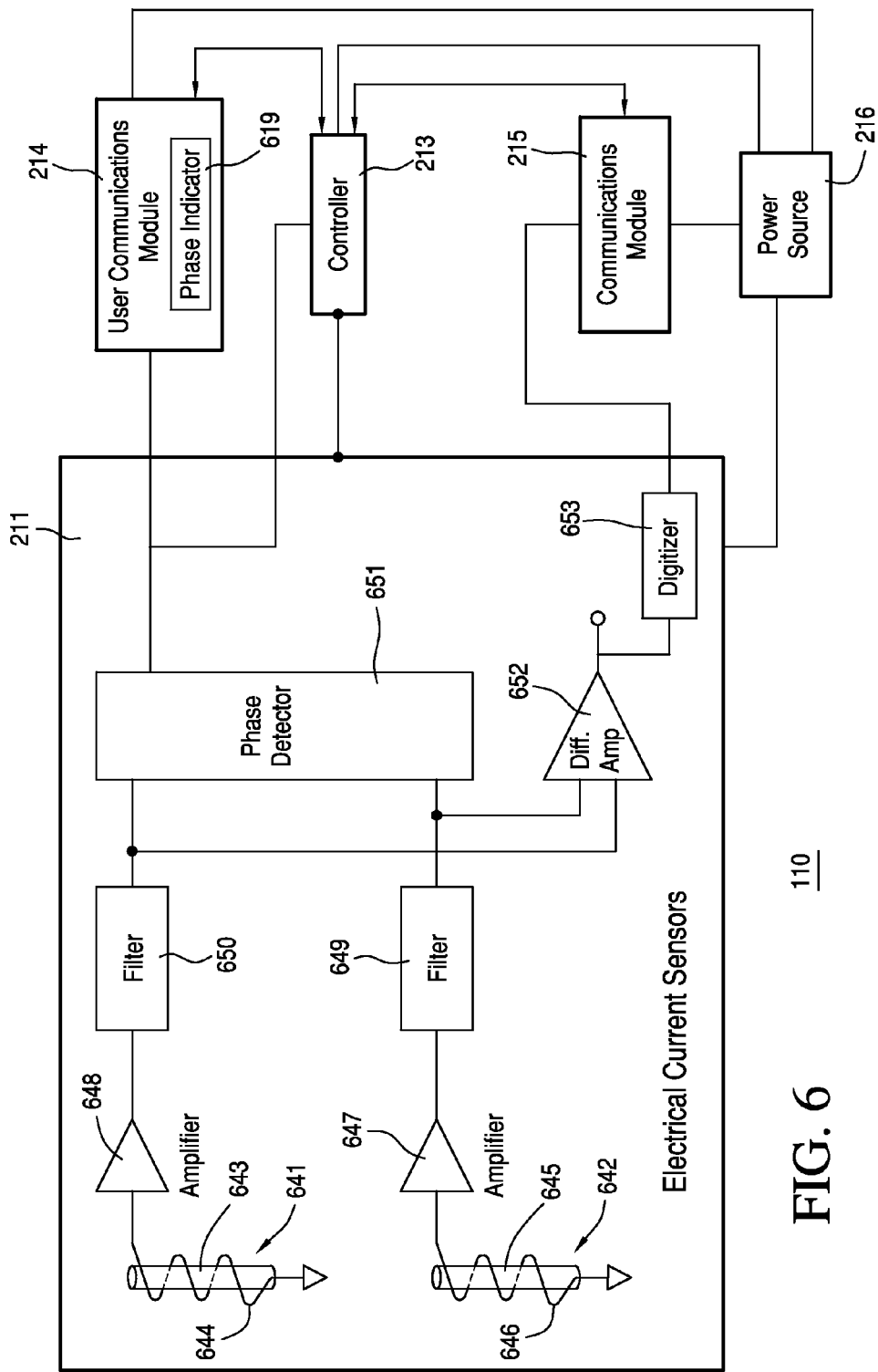
FIG. 6 illustrates an example of the sensing device of FIG. 2, according to the first embodiment.

FIG. 6 illustrates an example of electrical current sensor 211, according to the first embodiment. In these examples, electrical current sensor can include: (a) one or more sensors 641 and 642; (b) one or more amplifiers 647 and 648; (c) one or more filters 649 and 650; (d) one or more phase detectors 651; (e) at least one differential amplifier 652; and (f) at least one digitizer 653.

In some examples, system 100 can be configured to assist the user in the proper placement of sensing device 110 by indicating the proper placement with user communications module 214. In some examples, system 100 can determine proper placement by detecting an approximately 180 degree phase difference between sensors 641 and 642 that are disposed on opposite sides of a conductor (i.e., electrical power conductor 193 or 194). In the same or different examples, user communications module 214 can be co-located with sensing device 110 or user communications module 214 can be used and can be remote and linked to sensing device 100 over a wireless network.

Sensor 641 can include: (a) ferromagnetic core 643; and (b) a sensing coil 644 wrapped around ferromagnetic core 643. Sensor 642 can include: (a) ferromagnetic core 645; and (b) a sensing coil 646 wrapped around ferromagnetic core 645. In various examples, sensors 641 and 642 can be 2.5 millimeters (mm) to 12.7 mm in diameter. In other examples, electrical current sensor 211 only includes sensor 641 and does not include sensor 642, amplifier 647, filter 649, phase detector 651, and/or differential amplified 652. In this alternative embodiment, filter 649 or 650 is coupled to digitizer 653. In further embodiments, electrical current sensor 211 includes four, six, eight, or ten sensors.

The purpose of ferromagnetic cores 643 and 645 is to concentrate the magnetic field from sensing coils 644 and 646 to yield a larger sensor output voltage at the output terminals of sensing coils 644 and 646. The voltage at the output of sensing coils 644 and 646 is given by Faraday's law. That is, the voltage depends on the applied AC magnetic field, the physical dimensions of the coil and wire, the number of turns of wire in the coil, and the magnetic permeability of the core. In other examples, sensors 641 and 642 do not include the ferromagnetic cores 643 and 645, respectively.

As shown in FIG. 7, when electrical current sensor 211 is coupled to circuit breaker panel 190, one of sensors 641 and 642 can be located on each side of a conductor (i.e., electrical power conductor 193 or 194). In this embodiment, the induced voltage on sensor 641 is 180 degrees out of phase with sensor 642 because the magnetic field enters sensor 642 from the bottom while the magnetic field enters sensor 641 from the top.

A plot of the phase relationship between the voltage on sensors 641 and 642 is shown in FIG. 8. Referring to FIG. 8, when the AC current flowing in the conductor (i.e., electrical power conductor 193 or 194) induces a voltage V(sensor) at sensing coils 644 and 646. This voltage, V(sensor) is proportional to the current, I(sensor) carried by the conductor (i.e., electrical power conductor 193 or 194) i.e., V(sensor)=k*I(sensor). The constant of proportionality, k, can be found by drawing a known current through the conductor by temporarily connecting a calibration load (i.e., calibration load module 283 or 227 (FIG. 2)) to a circuit served by the conductor (i.e., electrical power conductor 193 or 194) and measuring the voltage induced in sensors 641 and 642 (FIG. 6). In some cases, more than one known current may be drawn to establish a multi-point calibration of the constant of proportionality.

Referring again to FIGS. 6, this configuration of two sensors (i.e., sensors 641 and 642) can be exploited to yield a sensing device 110 that automatically communicates to a user that it has been correctly placed with respect to a given current carrying conductor while rejecting interference from other sources, including other nearby conductors. This ability is useful in the electrically noisy environment found in a circuit breaker panel where there are many conductors near a particular conductor of interest.

Specifically, in some embodiment, the output of each of sensors 641 and 642 can be amplified using amplifiers 648 and 647, respectively and then filtered using filters 650 and 649, respectively. The output of filters 650 and 649 can be presented to phase detector 651 coupled to a phase indicator 619 in user communications module 214 (e.g., one or more LEDs). User communications module 214 is configured to indicate to the user that sensors 641 and 642 have been correctly placed with respect to a given current carrying conductor. The user can be instructed to move the sensor across the region where the main electrical power conductors are to be found, and stop movement once the phase indicator indicates that the phase difference between signals of sensors 641 and 642 is approximately 180 degrees. For example, when signals from sensors 641 and 642 are approximately 180 degrees out of phase, a green LED could light-up on the top of sensing device 110.

Amplifiers 648 and 647 and filters 650 and 649 are optional in some examples. The purpose of amplifiers 648 and 647 and filters 650 and 649 are to increase the signal level while rejecting noise at undesired frequencies and thus to increase the signal to noise ratio of the signals of sensors 641 and 642 in noisy environments. Amplifiers 648 and 647 can be operational amplifiers such as the type TL082 manufactured by Texas Instruments, Inc. Filters 650 and 649 can be either lumped element passive filters or active filters implemented with operational amplifiers. In general filters 650 and 649 are bandpass filters configured to pass the AC line frequency (e.g., 60 Hz in the US and Canada, or 50 Hz in Europe and Japan) while rejecting out of band noise.

Phase detector 651 can be either an analog phase detector circuit or a digital phase detector. A digital phase detector can be implemented with combinational logic, with programmable logic, or in software on a controller. In one embodiment, an integrated phase detector circuit such as the phase detector contained in the type 4046 or 74HC4046 phase locked loop integrated controllers manufactured by Texas Instruments, Inc. can be employed. In another embodiment, phase detector 651 is implemented by digitizing the sensor signals with an analog to digital converter, and then fitting an arctangent function to the vector of received samples from sensors 641 and 642. In a further embodiment, the filtering and phase detection functions are combined by using a periodogram based maximum likelihood estimator such as a complex fast Fourier transform (FFT) algorithm to find the signal magnitude and phase angle at only the AC line frequency while rejecting noise at other frequencies.

Phase indicator 619 can be any device that indicates to a user that the desired phase relationship between input signals of sensors 641 and 642 has been reached. In some embodiments, the phase indicator can be one or more LEDs. In other embodiments, phase indicator 619 can be a graphical or numerical display such as a liquid crystal display (LCD), or an audio tone that indicates to the user that the voltages of sensors 641 and 642 are nearly 180 degrees out of phase.

Differential amplifier 652 can be used to combine the signals from sensors 641 and 642 to yield a voltage or current signal proportional to current in the main electrical power conductor once the correct phase relationship has been established. This signal can be used as an input for calculations performed by controller 213. In the same or different example, communications module 215 can be used to convey to computational unit data including: (a) the proper placement of sensors 641 and 642 as indicated by the sensor phase relationship as well as (b) the differentially sensed signal from sensors 641 and 642.

Figure 9:
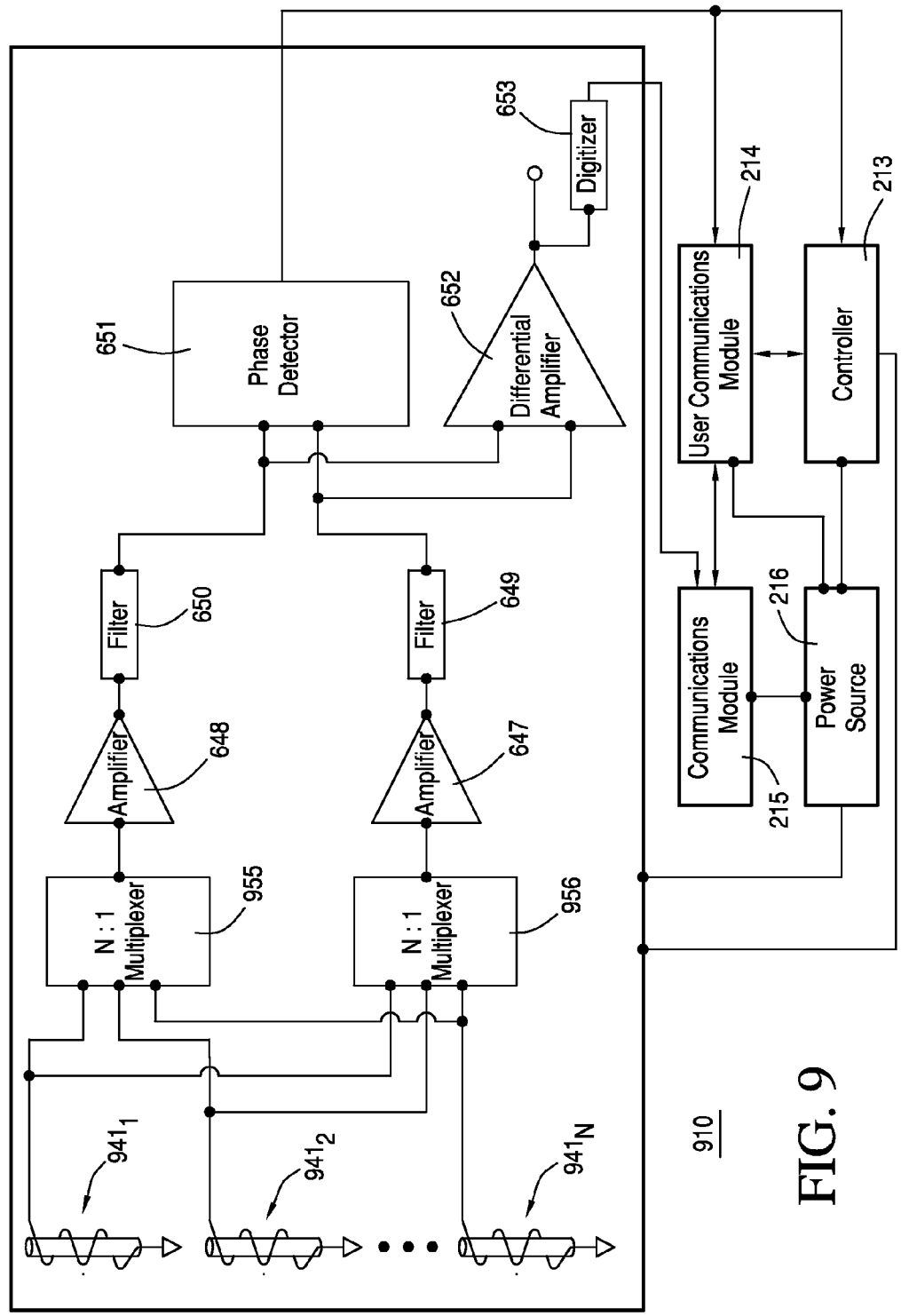
FIG. 9 illustrates an example of a sensing device, according to a second embodiment.

Turning to another embodiment, FIG. 9 illustrates an example of sensing device 910, according to a second embodiment. FIG. 10 illustrates an example of sensing device 910 over electrical power conductors 193 and 194, according to the second embodiment. In this example, a linear array of sensors $941_1, 941_2, \ldots, 941_N$ can be used where N is a number between 2 and 10. In other examples, N can be other numbers such as 4, 6, 8, 20, 50, or 100. One purpose of this linear array of sensors is to allow controller 213 to select automatically one or more pairs of sensors $941_1, 941_2, \ldots, 941_N$ so the user does not have to manually place sensing device 910 in the correct placement. In some embodiments, sensing device 910 can be used instead of sensing device 110 in system 100 of FIG. 1.

Referring to FIGS. 9 and 10, in this example, sensing device 910 can includes: (a) sensors $941_1, 941_2, \ldots, 941_N$; (b) amplifiers 647 and 648; (c) filters 649 and 650; (d) phase detectors 651; (e) differential amplifier 652; (f) digitizer 653; and (g) at least one multiplexer 955 and 956.

As shown in FIG. 10, the linear array of sensors $941_1, 941_2, \ldots, 941_N$ is coupled to multiplexers 955 and 956, which selects at least one sensor from sensors $941_1, 941_2, \ldots, 941_N$ for use as a magnetic field sensor to yield a signal proportional to current in main electrical power conductors 193 and/or 194.

In another embodiment, more than one conductor of electrical power conductors 193 and 194 are simultaneously sensed by sensing device 910. In this embodiment, controller 213 controls multiplexers 955 and 956 such that two distinct sensors from sensors $941_1, 941_2, \ldots, 941_N$ are selected that are adjacent to two different current carrying power conductors 193 and 194. In this embodiment, controller 213 controls multiplexers to select sensors based on the amplitude or phase angle of the sensor signal. In some embodiments, multiple sensor from sensors $941_1, 941_2, \ldots, 941_N$ are multiplexed under control of controller 213 to select distinct sensors, each of which having preferential magnetic field coupling to a distinct current carrying conductor.

Referring again to FIG. 1, system 100 can use calibration in some examples to achieve accurate current measurement in electrical power conductors 193 and 194. The potential need for calibration can be due to poorly controlled installation geometry, for example, when sensing device 110 or 910 (FIG. 9) is installed by an untrained user.

Figure 11:
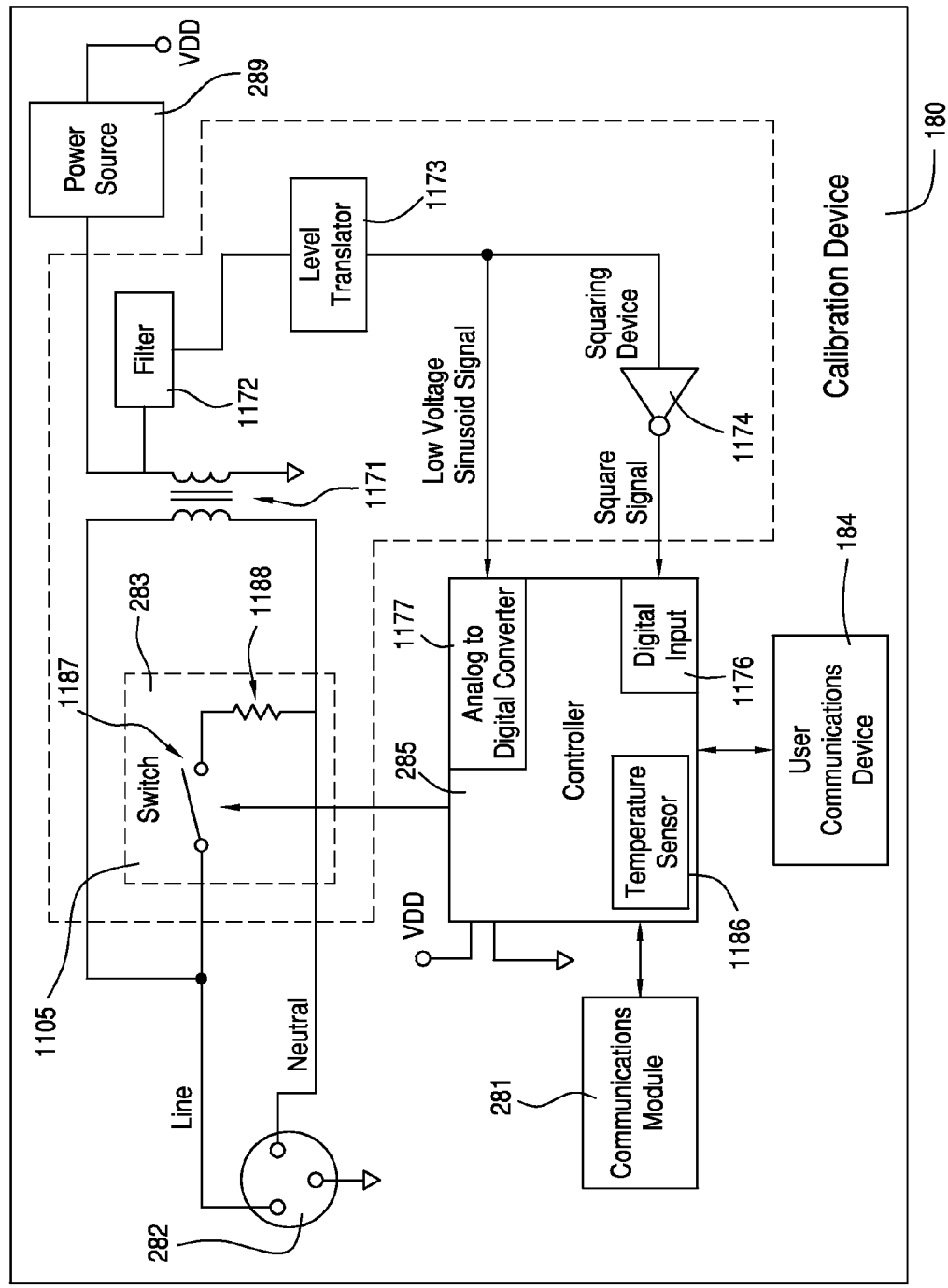
FIG. 11 illustrates an example of the calibration device of FIG. 1, according to the first embodiment.

FIG. 11 illustrates an example of calibration device 180, according to the first embodiment. Calibration device 180 is shown in FIG. 11 as a single circuit calibration device that is configured to switch a single calibration load to a single incoming conductor (i.e., electrical power conductor 193 or 194) to complete a circuit between a the incoming conductor, the single calibration load, and the neutral or return conductor (i.e., electrical power conductor 195). The switching signal is used to temporarily complete the circuit with the calibration load, which is used by calibration method 1800 of FIG. 18.

In some examples, calibration load module 283 can include: (a) a switched load 1105; (b) a transformer 1171; (c) a filter 1172; (d) a level translator 1173; and (e) a squaring device 1174. Switched load 1105 can include: (a) a switch 1187 and (b) a calibration load 1188. Controller 285 can include: (a) an analog-to-digital converter 1177; (b) a digital input 1176; and (c) a temperature sensor 1186.

In the embodiment of FIG. 11, calibration load module 283 can be designed to calibrate the measurement of a single current carrying conductor (a feeder to the branch circuit) being measured by sensing device 110. In this embodiment, a single calibration load 1188 is switched by switch 1187 between the line conductor (e.g., main electrical power conductors 193 and 194) and the neutral conductor (e.g., main electrical power conductor 195) under the control of a switching signal from a controller 285. In the United States, switched load 1105 can be used with a 120 V outlet. In other countries, switched load 1105 can be used with 240 V and other voltage outlets.

It should be appreciated that while calibration load 1188 and the calibration loads in FIGS. 14-17 are drawn as a resistor, calibration load 1188 and other calibration loads in FIGS. 14-17 can be any load including a reactive load, such as an inductor or capacitor, with or without a resistive component. Additionally, the calibration load can be a load with a variable resistance. Furthermore, it should be appreciated that while switch 1187 and other switches in FIGS. 14-17 are drawn as mechanical relay switches, the switches can be other forms of switching devices. For example, the switches can be a semiconductor switches such as a solid state relays, triacs, transistors such as a FETs (filed-effect transistors), SCRs (silicon-controller rectifiers), BJTs (bipolar junction transistors), or IGBTs (insulated-gate bipolar transistors), or other controllable switching devices.

As shown in FIG. 11, communications module 281 is coupled to controller 285 to enable the transfer of calibrated current measurements from calibration device 180 to computational unit 120. In some examples, communications module 281 can include a receiver and transmitter. Communications module 281 can include any form of wired or wireless communication device operating at any frequency and with any data link protocol. In one embodiment, communications module 281 includes a 2.4 GHz transceiver part number CC2500, available from Texas Instruments, Inc. In another embodiment, communications module 281 includes a 900 MHz transceiver, part number CC2010, available from Texas Instruments, Inc. In some embodiments, communications module 281 can communicate using any of the following communication protocols: WiFi (IEEE 802.11), Zigbee (IEEE 802.15.4), ZWave, or the SimpliciTI protocol. In another embodiment, a proprietary data communication protocol is employed. In further embodiment, the communication link between communications module 215 and communications modules 281 and/or 221 is achieved through the monitored conductor. In this embodiment, the communication link is comprised of power line communication (PLC) formed by injecting a transmitted signal into at least one conductor of the branch circuit to which the calibration device is coupled.

In the example shown in FIG. 11, power source 289 can include a Power source 289. Power source 289 can include an isolation transformer and a DC power supply. Power source 289 converts the incoming line voltage from an AC power line voltage, such as 120 V in the US and Canada, or 220 V in Europe, to a low DC voltage such as 3.3 V or 5 V DC to power controller 213 and other elements of calibration device 180.

Controller 285 can receive a sample of the incoming AC power line voltage, converted by level translator 1173 to a lower voltage AC signal that is proportional to the incoming AC power line voltage. In some embodiments, the incoming AC power line voltage is 120 V AC while the lower voltage AC signal is within the range of 0 to 3.3 V. In some embodiments, level translator 1173 is employed to shift the low voltage signal from a bipolar signal that alternates between +V and −V to a unipolar signal between 0 V and VDD, or another unipolar signal range that is within the valid voltage range of analog-to-digital converter 1177. Analog-to-digital converter 1177 can sample the incoming low voltage signal as shown in FIG. 12. In the same or different embodiments, filter 1172 can restrict the frequency range of the low voltage signal to the AC line frequency.

In many examples, analog-to-digital converter 1177 can be integrated with controller 285, or it may be separate from controller 213 but coupled to controller 285. The sampled AC line voltage enables controller 213 to measure the incoming AC line voltage to calibrate more accurately system 100 by calculating the current drawn by calibration load 1188 given the sampled low voltage signal, which is proportional to the AC line voltage. Furthermore, the sampled low voltage signal may be used to develop a phase reference that is synchronous to the AC line voltage.

Figure 13:
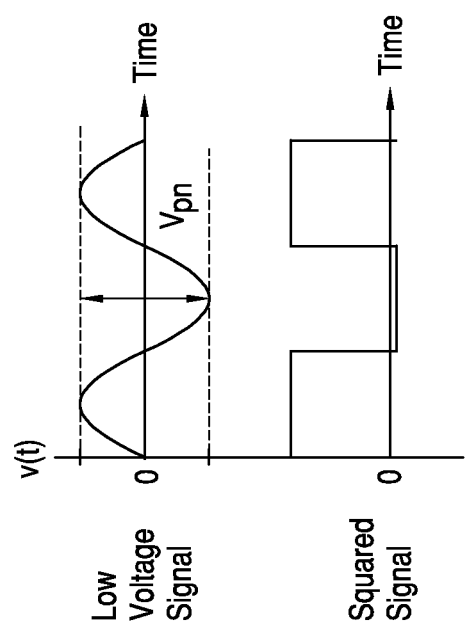
FIG. 13 illustrates exemplary graphs illustrating the relationship of a squared low voltage signal used to develop a phase reference and the low voltage signal of FIG. 12, according to an embodiment.

In some embodiments, controller 285 uses a squared low voltage signal to develop a phase reference. In these embodiments, squaring device 1174 creates the square low voltage signal. The squared low voltage signal can be a square wave that has the same period and zero crossing timing as the low voltage AC signal. This relationship between the squared signal and the low voltage signal is shown in FIG. 13. In some embodiment, squaring device 1174 can include a Schmitt trigger, a comparator, or a digital logic gate such as an inverter or a transistor level shifter. The square wave amplitude is chosen to be a logic level that is compatible with controller 285. The squared signal does not contain information about the amplitude of the incoming AC line voltage but it does contain phase information because the positive and negative-going edges of the squared signal are synchronous to the zero crossings of the incoming AC line voltage.

In some embodiments, the phase reference derived from either the low voltage signal or its squared counterpart is used to measure the relative phase angle between the calibrated current measurement reported by sensing device 110 and the incoming power line voltage. This relative phase angle measurement between voltage and current is used to account accurately for the power factor of reactive loads connected to the power conductor that is measured by sensing device 110. The power factor is the cosine of the phase angle between the voltage and current waveforms. This power factor can be computed directly from a sampled low voltage signal, or it may be indirectly computed in the case of the squared low voltage signal by fitting a sinusoid of the proper frequency to the edge transitions in the squared signal.

The power factor is the ratio of the real power flowing in the conductor compared to the apparent power flowing in the conductor. In some embodiments, it is preferential to report to the user of system 100 the real power flowing in electrical power conductors 193, 194, and 195 to better approximate the reading of a utility-supplied electrical power meter. In these embodiments, the phase information provided by the low voltage signal is critical to compute properly the predicted power.

Because the calibration load 1188 dissipates current when it is switched on using switch 1187, calibration load 1188 is subject to heating. This heating can endanger the safe operation of calibration load 1188 by causing thermal damage to calibration load 1188 itself, or to other components within the housing of calibration device 180, or to people or things that are proximate to calibration device 180.

In some embodiments, controller 285 includes a temperature sensor 1186 such as a bimetallic thermostat, a thermistor, or a semiconductor temperature sensor. In some embodiments, temperature sensor 1186 interrupts the switching signal to turn off calibration load 1188 when calibration load 1188 or the housing of calibration device 180 is too hot.

In further embodiments, controller 285 checks temperature reading of temperature sensor 1186 prior to turning on calibration load 1188 to ensure that calibration load 1188 or the housing of calibration device 180 is not too hot at the beginning of the calibration process. In still further embodiments, controller 285 can performs an extrapolation to determine if calibration load 1188 is likely to become too hot after a typical period of operation of calibration load 1188. In this embodiment, controller 285 acts to defer the calibration process until the process can be completed without calibration load 1188 or the housing of calibration device 180 becoming too hot.

In some embodiments, there are two different control mechanisms by which a controller controls the switching signal to switch 1187. The two methods correspond to two different processor locations that run the calibration process to obtain a calibrated current measurement.

In a first method, controller 285 is co-located with and controls calibration load module 283. Controller 285 also can obtain sensor readings from sensing device 110 (via communications module 281) and controller 213. Controller 285 performs the calibration process (described below in reference to FIG. 18) and obtains the calibrated current measurement. In these examples, calibration calculation module 229 can be located in calibration device 180, and not computational unit 120.

In the first method where controller 285 runs the calibration process, communications module 281 receives incoming signal measurements from sensing device 110 and/or computational unit 120. Controller 285 can calculate the calibrated current measurements using method 2000 of FIG. 20. After calculating the calibrated current measurements, calibration device 180 can communicate the calibrated current measurements to computational unit 120 for display and other uses.

Figure 18:
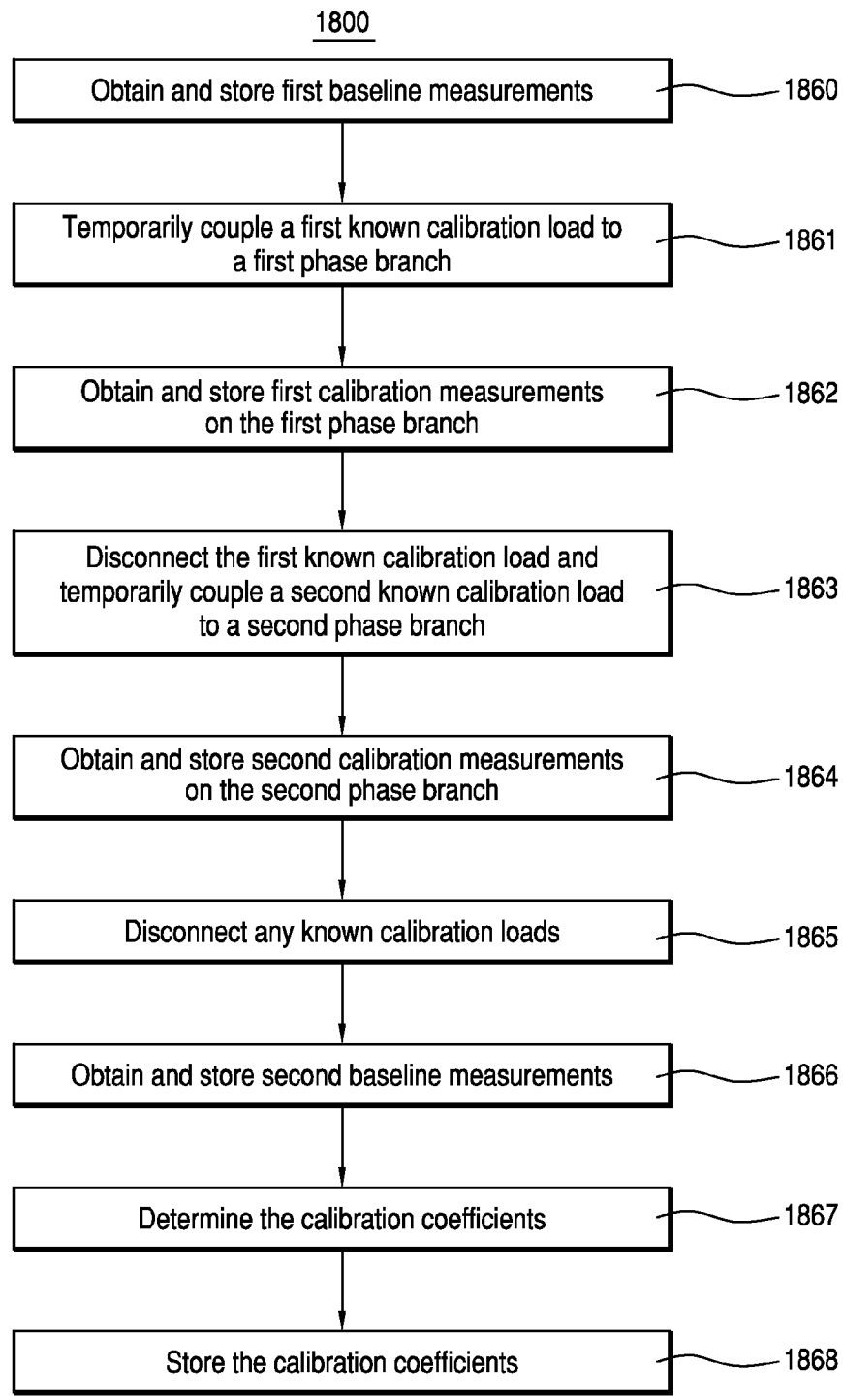
FIG. 18 illustrates a flow chart for a method of calibrating an electrical monitoring system, according to an embodiment.
Figure 20:
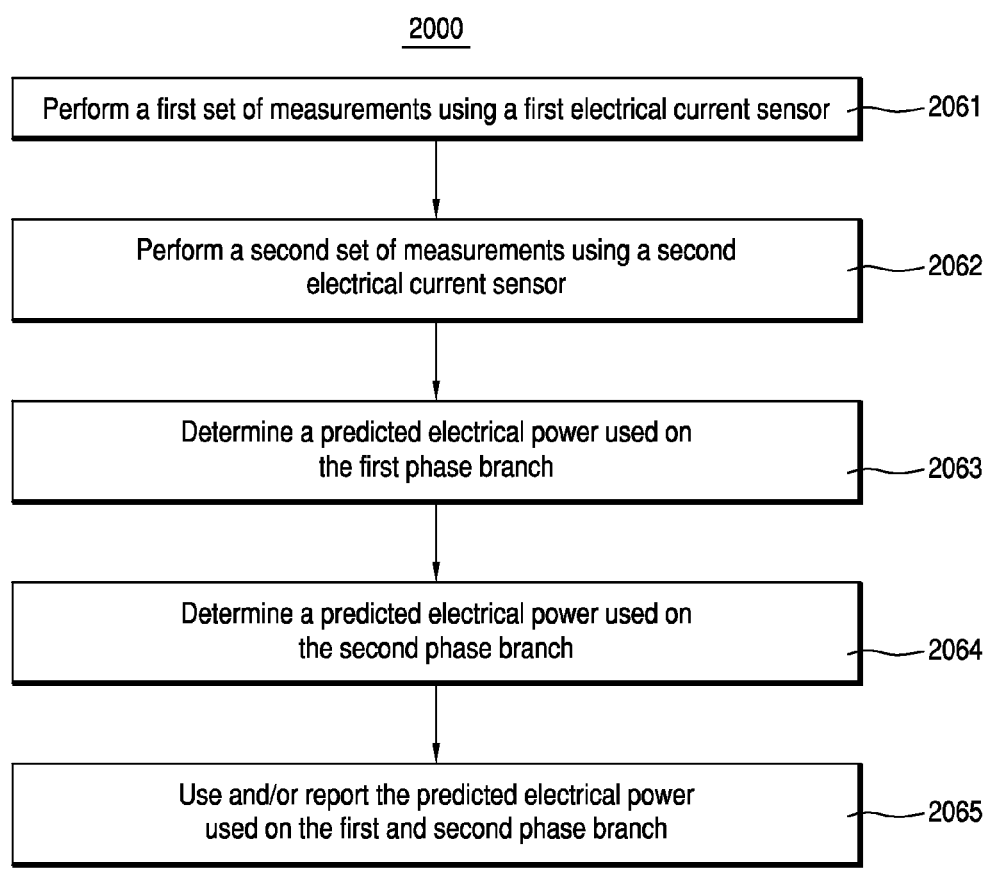
FIG. 20 illustrates a flow chart for a method of determining the predicted current in the main electrical power conductors, according to an embodiment.

In a second method, a remote processor, such controller 225 (FIG. 2) or controller 213 (FIG. 2), commands calibration load 1188 to switch on and off and this controller (controller 225 or controller 213) performs the calibration method 1800 of FIG. 18 and obtains the calibrated current measurement as described in method 2000 of FIG. 20.

When the second method is being used with controller 225 in control of the calibration, controller 225 receives a message via a communication link from controller 285. In some embodiments, controller 25 sends a message to turn on the calibration load for a specified period of time. In some embodiments, this period of time is selected from one or more predetermined periods of time. In other embodiments, calibration load 1188 is turned on until a turn-off message is received by controller 285 or until the expiration of a time-out timer or the activation of temperature sensor 1186 indicating that calibration load 1188 or its housing is too hot.

In further embodiments, controller 285 independently makes a decision to turn on the calibration load for a particular period of time. In some examples, controller 285 switches calibration load 1188 on and off for a particular period of time, while contemporaneously, previously, or at a later time sending a notification to controller 225 indicating that calibration load 1188 has been switched on. In this embodiment, controller 213 uses a known time offset between the messages received from controller 285 to synchronize the flow of the calibration procedure to calibration load 1188 on/off times indicated by a message received from controller 285 via a communication link. In further examples, controller 285 switches calibration load 1188 on and off in a sequence that is known to controller 213 and/or 225 (FIG. 2).

FIG. 11 illustrates one example of switched load 1105 in calibration device 180. Other possible configurations of the switched load are shown in FIGS. 14-17.

Figure 14:
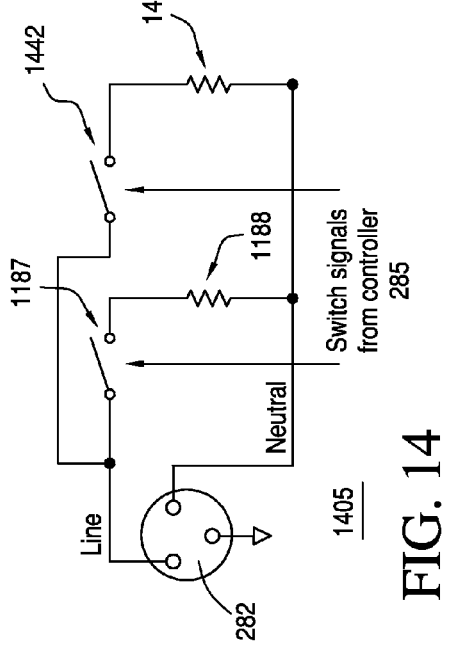
FIG. 14 illustrates an example of a switched load, according to a third embodiment.

Specifically, FIG. 14 illustrates an example of switched load 1405, according to a third embodiment. Switched load 1405 can include: (a) switches 1187 and 1442; and (b) calibration loads 1188 and 1441. In this embodiment, switched load 1405 replaces switched load 1105 in calibration device 180 of FIGS. 2 and 11.

In this embodiment, switched load 1405 can be configured to calibrate the measurement of a single current carrying conductor (a feeder to the branch circuit labeled "Line") being measured by sensing device 110. In this embodiment, controller 285 can switch between calibration loads 1188 and 1441 to provide two different sets of measurement to use in the calibration process. In other examples, switched load 1405 can include three or more switch of three or more calibration loads.

Figure 15:
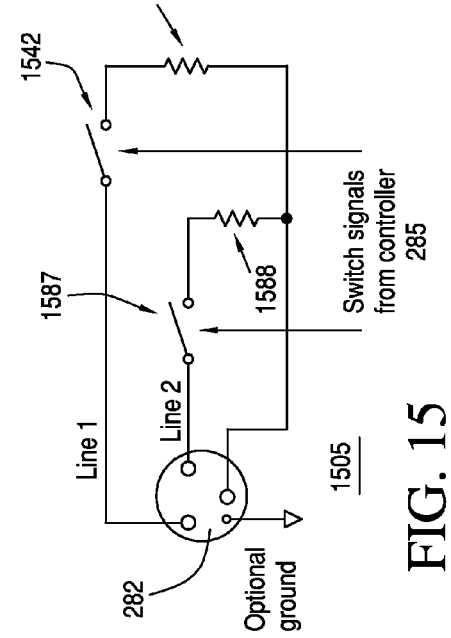
FIG. 15 illustrates an example of a switched load, according to a fourth embodiment.

FIG. 15 illustrates an example of switched load 1505, according to a fourth embodiment. Switched load 1505 can include: (a) switches 1587 and 1542; and (b) calibration loads 1588 and 1541. In this embodiment, switched load 1505 replaces switched load 1105 in calibration device 180 of FIGS. 2 and 11.

In this embodiment, switched load 1505 can be designed to calibrate the measurement of two current carrying conductor (a feeder to the branch circuit labeled "Line 1" and "Line 2") being measured by sensing device 110. In this embodiment, two distinct calibration loads 1588 and 1541 can be switched between individual line conductors and the neutral conductor under the control of a switching signal from controller 285. Controller 285 can control switching signals to electrically couple calibration loads as follows:

| Switch Enabled | Calibration Loads Coupled | Effect |
| --- | --- | --- |
| Switch 1587 is enabled | Calibration load 1541 | Permit the calibration of a measurement of a feeder to a branch circuit labeled Line 1 |
| Switch 1542 is enabled | Calibration load 1588 | Permit the calibration of a measurement of a feeder to a branch circuit labeled Line 2 |
| Switches 1587 and 1542 are enabled | Calibration loads 1541 and 1588 | Permit the calibration of feeders to branch circuits labeled Line 1 and Line 2 |
| Neither switch 1587 or 1542 is enabled | None | None |

Figure 16:
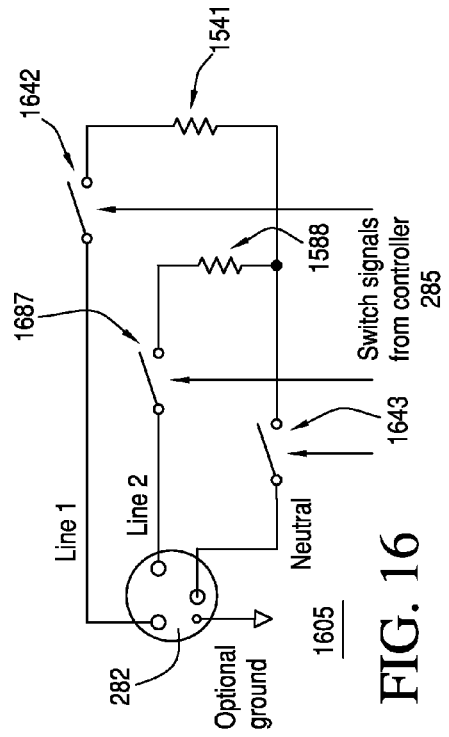
FIG. 16 illustrates an example of a switched load, according to a fifth embodiment.

FIG. 16 illustrates an example of switched load 1605, according to a fifth embodiment. Switched load 1605 can include: (a) switches 1687, 1642, and 1643; and (b) calibration loads 1588 and 1541. In this embodiment, switched load 1605 replaces switched load 1105 in calibration device 180 of FIGS. 2 and 11.

In this embodiment, switched load 1605 can also be configured to calibrate the measurement of more than one current carrying conductor (a feeder to the branch circuit labeled "Line 1" and "Line 2") being measured by sensing device 110. In this embodiment, two distinct calibration loads 1588 and 1541 are switched to enable calibration loads 1588 and 1541 to be connected either individually with a neutral return, or in a pair to the Line 1-Line 2 pair as is common in a split phase power system. Controller 285 can control switching signals to electrically couple calibration loads as follows:

| Switch Enabled | Calibration Loads Coupled | Effect |
| --- | --- | --- |
| Switches 1643 and 1642 are enabled | Calibration load 1541 with neutral return | Permit the calibration of a measurement of a feeder to the branch circuit labeled Line 1 |
| Switches 1643 and 1687 are enabled | Calibration load 1588 with neutral return | Permit the calibration of a measurement of a feeder to the branch circuit labeled Line 2 |
| Switches 1643, 1642, and 1687 are enabled | Calibration loads 1541 and 1588 with neutral return | Permit the calibration of feeders to branch circuits labeled Line 1 and Line 2 |
| Switches 1642, and 1687 are enabled but not switch 1643 | Calibration loads 1541 and 1588 in series between Line 1 and Line 2 | Permit the calibration of a split phase electrical system from a single split phase calibration device |
| None of switches 1643, 1642, and 1687 are enabled | None | None |

Figure 17:
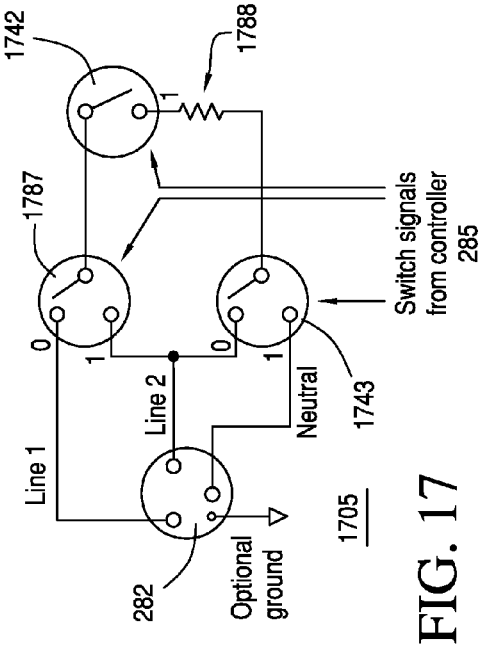
FIG. 17 illustrates an example of a switched load, according to a sixth embodiment.

FIG. 17 illustrates an example of switched load 1705, according to a sixth embodiment. Switched load 1705 can include: (a) switches 1787, 1742 and 1743; and (b) calibration load 1788. In this embodiment, switched load 1705 replaces switched load 1105 in calibration device 180 of FIGS. 2 and 11.

In the embodiment, switched load 1705 is also configured to calibrate the measurement of more than one current carrying conductor (a feeder to the branch circuit labeled "Line 1" and "Line 2") being measured by sensing device 110. In this embodiment, a single calibration load 1788 is switched to enable the calibration of two conductors plus a neutral as is common in a split phase power system. Switches 1787 and 1743 can be single pole double throw (SPDT) switches. Switches 1787 and 1743 can be used with calibration load 1788 to couple different combinations of the branch circuit conductors. Switched load 1705 can be cheaper to implement compared to switched load 1605 (FIG. 16) due to the single calibration load employed. Controller 285 can control switching signals to electrically couple calibration loads as follows:

| Switch Enabled | Calibration Loads Coupled | Effect |
| --- | --- | --- |
| Switch 1787 is in the 1 position, switch 1743 is in the 1 position, and switch 1742 is in the 1 position. | Calibration load 1788 with neutral return | Permit the calibration of a measurement of a feeder to the branch circuit labeled Line 2 |

| Switch Enabled | Calibration Loads Coupled | Effect |
| --- | --- | --- |
| Switch 1787 is in the 0 position, switch 1743 is in the 1 position, switch 1742 is in the 1 position. | Calibration load 1788 with neutral return | Permit the calibration of a measurement of a feeder to the branch circuit labeled Line 1 |
| Switch 1787 is in the 0 position, switch 1743 is in the 0 position, switch 1742 is in the 1 position. | Calibration load 1788 in series between Line 1 and Line 2 with no neutral return | Permit the calibration of a split phase electrical system from a single split phase calibration device |
| Switch 1787 is in the 0 or 1 position, switch 1743 is in the 0 or 1 position, and switch 1742 is in the 0 position (i.e., a disconnected position). | None | None |

In many examples, both phase lines of electrical infrastructure need to be calibrated. Accordingly, one of the calibration devices of FIGS. 11 and 14-17 would need to be plugged into the first phase branch and the second phase branch. In the example shown in FIG. 2, calibration device 180 is the first calibration device and computational unit 120 includes the second calibration device. In other examples, a single calibration device (e.g., a calibration device with one of switched load 1505, 1605, or 1705) can be coupled to a 240 V outlet, which is coupled to both the first and second phase branch.

In the embodiment where one of the calibration devices of FIGS. 11 and 14-17 is plugged into each of the first phase branch and the second phase branch, the calibration devices need to be able to communicate to each other, the sensing device, and the computation unit. Several different methods of communication could be implemented. For example, all of the calibration device could receive and transmit data. In other examples, one calibration device (e.g., calibration device 180 of FIG. 1) could transmit data and the second calibration device (e.g., computational unit 120 of FIG. 2) could receive data.

In some embodiments, the two calibration device can be in radio communication. For example, communications module 281 and communications module 221 of FIG. 2 can include a radio. The calibration devices are configured to determine if they are on different electrical phase branches by reporting the phase angle of the observed 60 Hz cycle to the other calibrators. In some examples, one calibration device can wirelessly report to the other calibration device when a zero crossing occurs in electrical current or voltage. An overlap in the received wireless messages will occur in the messages when both calibration devices are installed on the same electrical phase branch. If an offset exists between the observed zero crossing and the received message, the calibration devices are installed on different electrical phase branches.

in the same or different example, user communication device 184 on calibration device 180 (FIG. 1) can include a single red/green LED. A green LED can indicate that the two calibration devices are installed correctly on the two different phases. For example, the user first installs calibration device 180 of FIG. 1 (i.e., the transmitting calibration device) into an arbitrary electrical outlet. Then the user installs computational unit 120 of FIG. 1 (i.e., the receiving calibration device) into another electrical outlet. The LED of user communication device 184 can light up red to indicate that they are both on the same phase or green if they are on different phase branches. The user can move the second calibrator to different outlets until the green indicator of user communication device 184 is shown.

In other embodiments, wireless communication can also exist between each of sensing device 110, calibration device 180, and computational unit 120. In this embodiment, sensing device 110 can detect the two electrical phases in the breaker panel. As calibration device 180 cycles through its electrical loads, calibration device 180 can notify sensing device 110 and sensing device 110 can determine which phase calibration device 180 is coupled to. Computational unit 120 can also report to sensing device 110 when it begins its load cycle. Sensing device 110 observes which phase angles these changes are occurring to infer that the calibrators are installed on two different phases.

In still another example, a non-wireless communication method can be used to communicate between calibration device 180, and computational unit 120. In these examples, communications modules 221 and/or 281 can include a signal injector and/or signal receiver. In this example, calibration device 180 and computational unit 120 can send a signal over the electrical power infrastructure. For example, a simple 1 kHz (kilohertz) tone can be used. In the same or different examples, the signal consists of an amplitude modulated voltage injected on to one or more conductors of the electrical power infrastructure. In another embodiment, the signal consists of an amplitude modulated current drawn from the electrical power infrastructure. In a further embodiment, the signal consists of a frequency modulated voltage or current. In one embodiment, computational unit 120 can be designated as a transmitter of the signal, while calibration device 180 can be designed as the receiver. When calibration device 180 is plugged into an electrical outlet, user communication device 184 can light up a green LED if it cannot detect the presence of the signal being transmitted by the first device. If calibration device 180 and computational unit 120 are coupled to separate phase branches, calibration device 180 and computational unit 120 could not detect signals placed on the electrical power infrastructure by the other.

If calibration device 180 detects the signal, then a red light can indicate the two calibration devices are on the same phase. At this point, the user can be instructed to move either one of calibration device 180 or computational unit 120 to a different electrical outlet. In yet another embodiment, instead of communications modules 221 and 281 including a signal injector and/or receiver, communications modules 221 and 281 can include powerline communication (PLC) modules to allow calibration device 180 and computational unit 120 to communicate over the electrical power infrastructure.

Turning to another embodiment, FIG. 18 illustrates a flow chart for an embodiment of a method 1800 of calibrating an electrical monitoring system, according to an embodiment. Method 1800 is merely exemplary and is not limited to the embodiments presented herein. Method 1800 can be employed in many different embodiments or examples not specifically depicted or described herein. In some embodiments, the activities, the procedures, and/or the processes of method 1800 can be performed in the order presented. In other embodiments, the activities, the procedures, and/or the processes of the method 1800 can be performed in any other suitable order. In still other embodiments, one or more of the activities, the procedures, and/or the processes in method 1800 can be combined or skipped.

Method 1800 can be considered to describe a general method of calibrating a sensing device. This method can involve determining one or more calibration coefficients that can be used to calculate the predicted current in the electrical power infrastructure of the structure in method 2000 of FIG. 20. The method described below can be used to accurately calculate the calibration coefficients regardless of the position of the sensing device 110 (FIG. 1) on panel 196 (FIG. 1) with the exception of the following points: (a) if electrical current sensors 211 (FIG. 2) are placed so far away from the main power conductors 193 and 194 (FIG. 1) that almost no discernable signal from main power conductors 193 and 194 is measured; and (b) if all of the electrical current sensors 211 (FIG. 2) are placed very close to neutral electrical power conductor 195 (FIG. 1) and far away from electrical power conductors 193 and 194.

Method 1800 in FIG. 18 includes an activity 1860 of obtaining and storing one or more first baseline measurements. In some examples, sensing device 110 (FIG. 2) can be used to obtain first baseline measurements using electrical current sensors 211 (FIG. 2). These first baseline measurements can include the nominal current flowing in at least one of power conductor 193 or 194 (FIG. 1) due to electrical devices that are drawings electrical power. Additionally, at every sensor (e.g., sensors 641 and 642 (FIG. 6) or sensors 941$_1$, 941$_2$, . . . 941$_N$ (FIG. 9)), an amplitude and phase measurement can be made. Each amplitude reading, L, is stored with the name $L_{old-N}$ and each phase reading, Ø, is stored with the name $Ø_{old-N}$, where N is the number of the sensor. In some examples, the first baseline measurements are made on both the first phase branch and a second phase branch.

In some examples, activity 1860 also includes determining the amplitude and phase angle of the voltage. The phase angle of the voltage can be used to help calculate the phase angle of the current. In some examples, electrical voltage sensor 228 of FIG. 2 can be used to determine the phase angle of the voltage.

Subsequently, method 1800 of FIG. 18 includes an activity 1861 of temporarily coupling a first known calibration load to the first phase branch. In some examples, calibration device 180 (FIGS. 1 and 11) can coupled one of the calibration loads in switched loads 1105, 1405, 1505, 1605 or 1705 of FIGS. 11, 14, 15, 16, and 17, respectively.

Next, method 1800 of FIG. 18 includes an activity 1862 of obtaining and storing one or more first calibration measurements on the first phase branch. In some examples, sensing device 110 (FIG. 2) can be used to obtain the first calibration measurements from electrical current sensors 211 (FIG. 2). In some examples, the first calibration measurements are performed while a known calibration load from switched load 1105, 1405, 1505, 1605, or 1705 of FIGS. 11, 14, 15, 16, and 17, respectively, is coupled to first phase branch (e.g., Line 1 in FIGS. 15-17). This first known calibration load will pull a known current $L_{cal-1}$. These first calibration measurements can include the nominal current flowing in at least one of power conductor 193 or 194 (FIG. 1) due to appliances that are drawings electrical power and the first known calibration load.

For example, at every sensor (e.g., sensors 641 and 642 (FIG. 6) or sensors 941$_1$, 941$_2$, . . . 941$_N$ (FIG. 9)), an amplitude and phase angle measurement is made. Each amplitude reading, L, is stored with a name such as $L_{new-N-1}$ and each phase angle reading, Ø, is stored with the name such as $Ø_{new-N-1}$, where N is the number of the sensor.

In some examples, activity 1862 also includes determining the amplitude and phase angle of the voltage. The phase angle of the voltage can be used to help calculate the phase angle of the current. In some examples, electrical voltage sensor 228 of FIG. 2 can be used to determine the phase angle of the voltage.

Method 1800 in FIG. 18 continues with an activity 1863 of disconnecting the first know calibration load and temporarily coupling a second known calibration load to a second phase branch. In some examples, calibration device 180 (FIGS. 1 and 11) can coupled one of the calibration loads in switched load 1405, 1505, or 1605 of FIGS. 14, 15, and 16, respectively. In some examples, the second known calibration load is coupled to a second phase branch (e.g., Line 2 in FIGS. 15-17).

Subsequently, method 1800 of FIG. 18 includes an activity 1864 of obtaining and storing second calibration measurements on the second phase branch. In some examples, sensing device 110 (FIG. 2) can be used to obtain the second calibration measurements from electrical current sensors 211 (FIG. 2). These second calibration measurements can include the nominal current flowing in at least one of power conductor 193 or 194 (FIG. 1) due to appliances that are drawings electrical power and the second known calibration load. In some examples, the second calibration measurements are performed while a known calibration load is coupled to the second phase branch (e.g., Line 2 in FIGS. 15-17). The second known calibration load will pull a known current $L_{cal-2}$.

For example, at every sensor (e.g., sensors 641 and 642 (FIG. 6) or sensors 941$_1$, 941$_2$, . . . 941$_N$ (FIG. 9)), an amplitude and phase angle measurement is made. Each amplitude reading, L, is stored with the name $L_{new-N-2}$ and each phase angle reading, Ø, is stored with the name such as $Ø_{new-N-2}$ where N is the number of the sensor.

In some examples, activity 1864 also includes determining the amplitude and phase angle of the voltage. The phase angle of the voltage can be used to help calculate the phase angle of the current. In some examples, electrical voltage sensor 228 of FIG. 2 can be used to determine the phase angle of the voltage.

Next, method 1800 of FIG. 18 includes an activity 1865 of disconnecting any known calibration loads (i.e., the second calibration load) from power conductors 193, 194, and/or 195 (FIG. 1).

Method 1800 in FIG. 18 continues with an activity 1866 of obtaining and storing one or more second baseline measurements. In some examples, sensing device 110 (FIG. 2) can be used to obtain the second baseline measurements from electrical current sensors 211 (FIG. 2). This second baseline measurements can include the nominal current flowing in at least one of power conductor 193 or 194 (FIG. 1) due to appliances that are drawings electrical power. The purpose of this second baseline reading is to ensure that the baseline load observed in activity 1861 has not changed during the calibration process. If the measurements in activity 1866 are equal to the measurement from 1861 within a predetermined amount, the measurements from activity 1866 can be discarded. If the measurements in activity 1866 are outside the predetermined amount, the measurement from 1861 can be discarded. In other examples, activity 1866 can be skipped.

In some examples, activity 1866 also includes determining the amplitude and phase angle of the voltage. The phase angle of the voltage can be used to help calculate the phase angle of the current. In some examples, electrical voltage sensor 228 of FIG. 2 can be used to determine the phase angle of the voltage.

Subsequently, method 1800 of FIG. 18 includes an activity 1867 of determining the calibration coefficients. In some examples, activity 1867 include applying a sensor calibration equation(s) to the baseline measurement and each of the calibration measurements to solve for the calibration factors of sensing device 110 (FIG. 1) to yield a calibrated current measurement in the at least one conductor that is sensed by sensing device 110. In some examples, calibration calculation module 229 (FIG. 2) can determine the calibration coefficients as described below.

Figure 19:
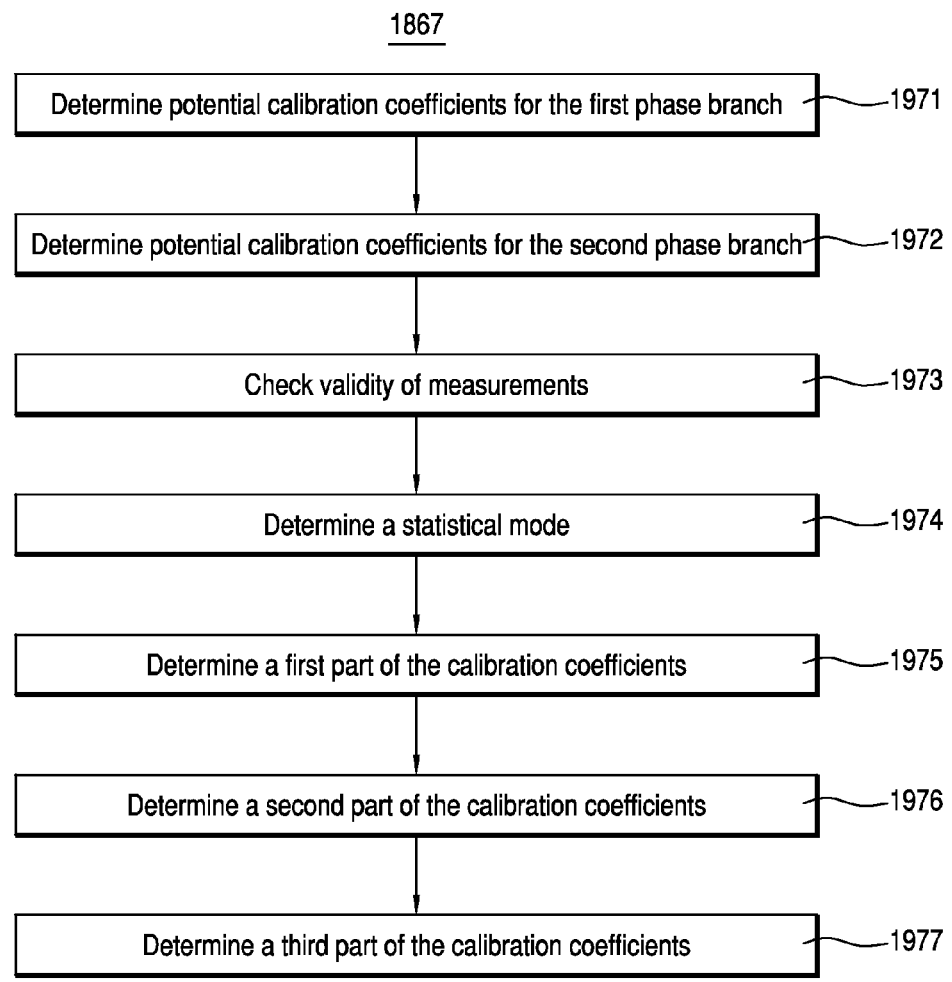
FIG. 19 illustrates a flow chart for an activity of determining the calibration coefficients, according to an embodiment.

FIG. 19 illustrates a flow chart for an exemplary embodiment of activity 1867 of determining the calibration coefficients, according to the first embodiment. In some examples, activity 1867 can broadly include calculating the calibration coefficients, $\emptyset_M$, $K_1$, $K_2$, $Y_1$, and $Y_2$. In other examples, other calibration coefficients can be determined.

Referring to FIG. 19, activity 1867 includes a procedure 1971 of determining potential calibration coefficients for the first phase branch. In some examples, for each sensor 1 through N (where N is the number of sensors in the electrical current sensor), procedure 1971 can include calculating $X_{N-1}$ and $\emptyset_{M-N-1}$ using $L_{old-N}$, $\emptyset_{old-N}$, $L_{cal-1}$, $L_{new-N-1}$, and $\emptyset_{new-N-1}$, where:

$$X_{N-1}=\sqrt{\{L_{old-N}^2+L_{new-N-1}^2-2*L_{old-N}*L_{new-N-1}*\cos(\emptyset_{old-N}-\emptyset_{new-M-1})\}}/L_{cal-1}$$

and $$\emptyset_{M-N-1}=\emptyset_{new-N-1}-\sin^{-1}[(L_{old-N}*\sin(\emptyset_{old-N}-\emptyset_{new-N-1}))/(X_{N-1}*L_{cal-1})]$$

Additionally, in some examples, if $\emptyset_{M-N-1}>180°$, then $$\emptyset_{M-N-1}=\emptyset_{M-N-1}-180°$$

and $$X_{N-1}=X_{N-1}*(-1)$$

Activity 1867 in FIG. 19 continues with a procedure 1972 of determining potential calibration coefficients for the second phase branch. In some examples, for each sensor 1 through N, procedure 1972 can include calculating $X_{N-2}$ and $\emptyset_{M-N-2}$ using $L_{old-N}$, $\emptyset_{old-N}$, $L_{cal-2}$, $L_{new-N-2}$, and $\emptyset_{new-N-2}$ where:

$$X_{N-2}=\sqrt{\{L_{old-n}^2+L_{new-N-2}^2-2*L_{old-N}*L_{new-N-2}*\cos(\emptyset_{old-N}-\emptyset_{new-N-2})\}}/L_{cal-2}$$

and $$\emptyset_{M-N-2}=\emptyset_{new-N-2}-\sin^{-1}[(L_{old-N}*\sin(\emptyset_{old-N}-\emptyset_{new-N-2}))/(X_{N-2}*L_{cal-2})]$$

Additionally, in some examples, if $\emptyset_{M-N-2}>180°$, then $$\emptyset_{M-N-2}=\emptyset_{M-N-2}180°$$

and $$X_{N-2}=X_{N-2}*(-1)$$

Subsequently, activity 1867 of FIG. 19 includes a procedure 1973 of checking the validity of the measurements. In procedure 1973, if $\emptyset_{M-N-1}=\emptyset_{M-N-2}$ within a predetermined tolerance (e.g. 0.1%, 1%, 5%, 10%, or 20%) for each sensor 1 through N, the measurements for the sensor are kept. If $\emptyset_{M-N-1}\neq\emptyset_{M-N-2}$, within the predetermined tolerance, the phase angles for that sensor are discarded.

Next, activity 1867 of FIG. 19 includes a procedure 1974 of determining a statistical mode, $\emptyset_{mode}$, for $\emptyset_{M-N-1}$ for the sensors not discarded in procedure 1973. In some examples, the statistical mode is the most frequently occurring phase angle within the predetermined tolerance for the sensors not discarded in procedure 1973.

Activity 1867 in FIG. 19 continues with a procedure 1975 of determining a first part of the calibration coefficients. In some examples, from the remaining sensors, procedure 1975 includes choosing the sensor with the highest value $X_{N-1}$ and assign $X_{N-1}=K_1$ and $X_{N-2}=K_2$ and $\emptyset_{M-N-1}=\emptyset_{M-K}$. This chosen sensor will be referred to as sensor K from hereon. Sensor K can be discarded from the list of available sensor candidates for the rest of activity 1867.

Subsequently, activity 1867 of FIG. 19 includes a procedure 1976 of determining a second part of the calibration coefficients. In some examples, from the remaining sensors, procedure 1976 includes choosing the sensor with the highest value $X_{N-2}$ and assign $X_{N-2}=Y_1$ and $X_{N-2}=Y_2$ and $\emptyset_{M-N-2}=\emptyset_{M-Y}$. This chosen sensor will be referred to as sensor Y from hereon.

Next, activity 1867 of FIG. 19 includes a procedure 1977 of determining a third part of the calibration coefficients. In some examples, $\emptyset_M$ is calculated where:

$$\emptyset_M=[\emptyset_{M-Y}+\emptyset_{M-K}]/2$$

The example of the formulas used to determine the calibration coefficients above are just exemplary. In other examples, other formulas (e.g., linear, non-linear, quadratic, and/or iterative equations) can be used to calculate the same or different calibration coefficients.

For example, the sensing device can be calibrated (and the predicted current determined) using only sensor. In this example, the sensor is placed at a location such that the magnetic field from main electrical power conductors 193 and 194 (FIG. 1) is symmetric at the sensor. That is, the magnetic field from main electrical power conductors 193 and 194 (FIG. 1) is symmetric at the sensor. In addition, in this example, sensor Z is at a location where the magnetic field from main electrical power conductor 195 (FIG. 1), representing the neutral return conductor, is small and can be ignored.

Let us call the sensor at this point where the magnetic fields are symmetric sensor Z. In this example, the current measured in sensor Z is equal to $$L_z=K_z*L_{predicted}$$

where $L_z$ is the current measured by sensor Z, $K_z$ is a constant, and $L_{predicted}$ is the predicted combined current in the first phase branch and the second phase branch.

In this example, the baseline current measurement made at sensor Z in activity 1860 or 1866 can be stored as $L_{z-baseline}$. The first calibration measurements made at sensor Z can be stored at $L_{z-cal}$ and the current of the first known calibration load can be AP. In this example, $K_z$ can be calculated where:

$$K_z=(L_{z-cal}-L_{z-baseline})/\Delta P$$

In other examples, other calibration equations can be used that require more than two calibration measurements. In these examples, activities 1861-1866 (FIG. 18) can be repeated as many times as needed with different calibration loads to obtain the needed number of calibration points.

After procedure 1977 is complete, activity 1867 of calculating of the calibration coefficients is complete.

Referring again to FIG. 18, method 1800 of FIG. 18 continues with an activity 1868 of storing the calibration coefficients. In some examples, the calibration coefficients can be stored in memory 226 of computational unit 120 of FIGS. 1 and 2. In the same or different examples, the calibration coefficients can be stored in memory of sensing device 110 and/or calibration device 180 of FIG. 1. In still other embodiments, the calibration coefficients can be transmitted to a remote server for storage and use. After activity 1868, method 1800 is complete.

FIG. 20 illustrates a flow chart for an embodiment of a method 2000 of determining the predicted current in the electrical power conductors. Method 2000 is merely exemplary and is not limited to the embodiments presented herein. Method 2000 can be employed in many different embodiments or examples not specifically depicted or described herein. In some embodiments, the activities, the procedures, and/or the processes of method 2000 can be performed in the order presented. In other embodiments, the activities, the procedures, and/or the processes of the method 2000 can be performed in any other suitable order. In still other embodiments, one or more of the activities, the procedures, and/or the processes in method 2000 can be combined or skipped.

Method 2000 describes a general method of determining the predicted electrical power (and/or electrical current) used in the electrical power conductors. This method involves using several predetermined calibration coefficients (see method 18 of FIG. 18) to determine the predicted current in the electrical power infrastructure of the structure. The method described below can be used to accurately calculate the predicted currents regardless of the position of the sensing device 110 (FIG. 1) on panel 196 (FIG. 1) with the exception of the following points: (a) if electrical current sensors 211 (FIG. 2) are placed so far away from the main power conductors 193 and 194 (FIG. 1) that almost no discernable signal is measured; and (b) if all of the electrical current sensors 211 (FIG. 2) are placed very close to neutral electrical power conductor 195 (FIG. 1) and far away from electrical power conductors 193 and 194. In some examples, method 2000 can broadly include calculating the predicted current, $L_{1\text{-predicted}}$ and $L_{2\text{-predicted}}$ (as would be reported by the electrical utility providing the electrical power) on each branch of electrical power infrastructure (e.g., the first and second phase branches).

In some examples, method 1800 of FIG. 18 and method 2000 can be combined to create a method of using a power consumption measurement device. Alternatively, method 1800 of FIG. 18 combined with method 2000 can be considered a method of determining the predicted current (and/or electrical power) in the electrical power conductors. In these embodiments, method 1800 can be performed once to determine the calibration coefficients and method 2000 can be repeatedly before to determine the predicted current (and/or electrical power) being used by the load of the structure at various times.

Referring to FIG. 20, method 2000 includes an activity 2061 of performing a first set of measurements using a first electrical current sensor. In various embodiment, one of electrical current sensors 211 (FIG. 2) can be used to perform the first set of measurements. In some examples, activity 2061 can include measuring an amplitude and phase angle at the sensor K. The amplitude reading can be stored with the name $L_K$ and the phase angle reading can stored with the name $Ø_K$.

In some examples, activity 2061 also includes determining the amplitude and phase angle of the voltage. The phase angle of the voltage can be used to help calculate the phase angle of the current. In some examples, electrical voltage sensor 228 of FIG. 2 can be used to determine the phase angle of the voltage.

Subsequently, method 2000 of FIG. 20 includes an activity 2062 of performing a second set of measurements using a second electrical current sensor. In various embodiment, one of electrical current sensors 211 (FIG. 2) can be used to perform the first set of measurements. In some examples, activity 2063 can include measuring an amplitude and phase angle of the current at the sensor Y. The amplitude reading can be stored with the name $L_Y$ and the phase angle reading can stored with the name $Ø_Y$.

In some examples, activity 2062 also includes determining the amplitude and phase angle of the voltage. As discussed above, the phase angle of the current is equal to the phase angle measured by the sensor minus the phase angle of the voltage. In some examples, electrical voltage sensor 228 of FIG. 2 can be used to determine the phase angle of the voltage.

Next, method 2000 of FIG. 20 includes an activity 2063 of determining a predicted electrical power used in a first phase branch. In some examples, activity 2063 can include determining amplitude, $L_1$, of the first phase branch and phase angle, $Ø_1$, of the first phase branch using the calibration coefficients $Ø_M$, $K_1$, $K_2$, $Y_1$, and $Y_2$ where:

$$L_1 = [\sqrt{\{(L_K/K_2)^2 + (L_Y/Y_2)^2 - 2*(L_K/K_2)*(L_Y/Y_2)*\cos(Ø_K - Ø_Y)\}}] / [(K_1/K_2) - (Y_1/Y_2)]$$

and $$Ø_1 = \tan^{-1}[\{(L_K/K_2)*\sin(Ø_K - ØO_M) - (y/Y_2)*\sin(Ø_Y - Ø_M)\} / \{(L_K/K_2)*\cos(Ø_K - Ø_M) - (L_Y/Y_2)*\cos(Ø_Y - Ø_{OM})\}]$$

In some examples, the predicted power, $P_{1\text{-predicted}}$, in the first phase branch can be the electrical power in the first phase branch as would be reported by the electrical utility. In some embodiments, the predicted current, $L_{1\text{-predicted}}$, in the first phase branch is:

$$P_{1\text{-predicted}} = V * L_1 * \cos(Ø_1)$$

where V is the voltage measured in activity 2062.

Method 2000 in FIG. 20 continues with an activity 2064 of determining a predicted electrical power used in a second phase branch. In some examples, activity 2064 can include determining amplitude, $L_2$, of the second phase branch and phase angle, $Ø_2$, of the second phase branch using the calibration coefficients $Ø_M$, $K_1$, $K_2$, $Y_1$, and $Y_2$ where:

$$L_2 = [\sqrt{\{(L_K/K_1)^2 (y/Y_1)^2 - 2*(L_K/K_1)*(L_Y/Y_1)*\cos(Ø_K - Ø_Y)\}}] / [(K_2/K_1) - (Y_2/Y_1)]$$

and $$Ø_2 = \tan^{-1}[\{(L_K/K_1)*\sin(Ø_K - Ø_M) - (L_Y/Y_1)*\sin(Ø_Y - Ø_M)\} / \{(L_K/K_1)*\cos(Ø_K - ØO_M) - (L_Y/Y_1)*\cos(Ø_Y - Ø_M)\}]$$

In some examples, the predicted electrical power, $P_{2\text{-predicted}}$, in the second phase branch can be the electrical power in the second phrase branch as would be reported by the electrical utility. In some embodiments, the predicted current, $P_{2\text{-}predicted}$, in the second phase branch is:

$$P_{2\text{-}predicted} = V * L_2 * \cos(\varnothing_2)$$

where V is the voltage measured in activity 2062.

In a second example where the sensing device is using only one sensor Z, determining the predicted power, $P_{predicted}$ is relatively simple. In this example, sensor Z has been placed at a location such that the magnetic field from main electrical power conductors 193 and 194 (FIG. 1) is symmetric at sensor Z and sensor Z is at a location where the magnetic field from main electrical power conductor 195 (FIG. 1) is small and can be ignored. In this example, the electrical power measured in sensor Z can be calculated where:

$$P_{predicted} = V * L_Z K_Z$$

and where V is the voltage measured in activity 2062, $L_z$ is the current measured by sensor Z in activity 2061, $K_z$ is a constant (already determined in activity 1867 of FIG. 18).

Method 2000 in FIG. 20 continues with an activity 2065 of using and/or reporting the predicted current in the first and second phase branch. The total predicted electrical power, $P_{predicted}$, is the sum of the predicted electrical power in the first phase branch and the predicted electrical power the second phase branch:

$$P_{predicted} = P_{2\text{-}predicted} + P_{1\text{-}predicted}$$

In some examples, the electrical power used by the load in the structure (i.e., $P_{predicted}$) can be displayed to the user on user communications device 134 of computational unit 120 (FIGS. 1 and 2). In other examples, the electrical power used (and/or the predicted current) can be communicated to the electrical utility providing the electrical power or can be reported to other entities.

In yet other embodiments, the predicted current can be used in disaggregating loads based on step change and phase angle between the observed current and voltage. Computational unit 120 can determine and assign a step change (the increase or decrease in current) to one or more electrical device in the structure to indicate its usage. Further disaggregation can be accomplished by observing the presence of 120 V and 240 V appliances from the current data on each phase branch. In addition to aggregate current step changes, step changes on each individual phase branch further identifies the presence of a different load or appliance (i.e., similar loads installed at different locations in the building). The change in phase angle observed due to a device's internal reactance allows the identification of inductive loads (i.e., fans, motors, microwaves, compressors). The predicted reactance is not required, but rather the observed raw phase angles are sufficient as long as they are associated with a device a priori. In some examples, the momentary change in current consumption on the electrical power infrastructure can constitutes a device's start-up characteristic, which can characterize residential appliances. This technique involves the use of template matching on a known library of start-up signatures to classify unknown loads. This feature space is much less susceptible to overlapping categories of devices and is able to separate many devices with similar load characteristics. For example, two motors with similar real and reactive power consumption can exhibit highly different start-up features, and thus be disaggregated. This approach can be appropriate for electrical devices that consume large current loads or at least consume large currents during start-up. Using these activities, loads on the electrical power infrastructure can be disaggregated. After activity 2065, method 2000 is complete.

Figure 21:
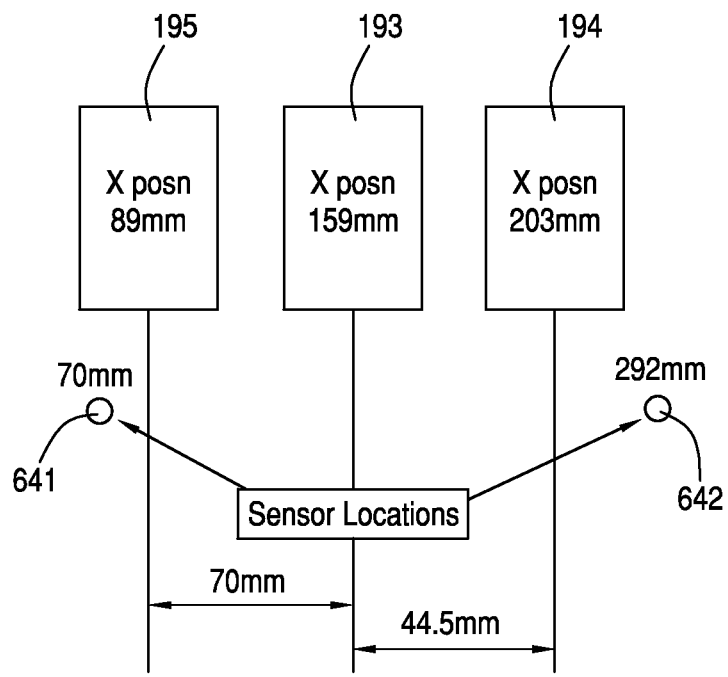
FIG. 21 illustrates an example of a first location of two electrical current sensors relative to the main electrical power conductors in an exemplary sensing device, according to an embodiment.
Figure 22:
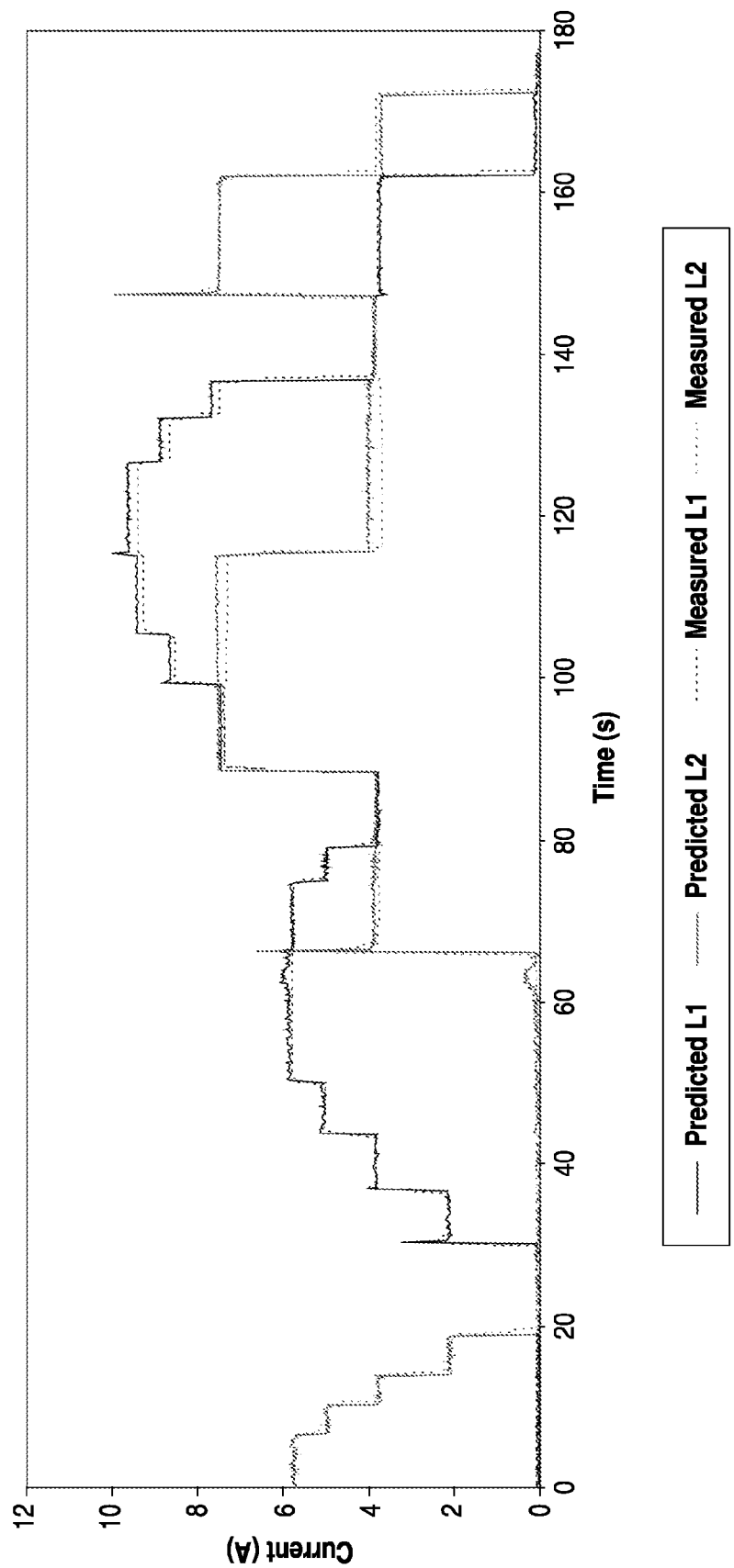
FIG. 22 illustrates a graph comparing a predicted current compared to the measured currents for the electrical current sensors of FIG. 21.

FIG. 21 illustrates an example of a first location of two electrical current sensors relative to main electrical power conductors 193, 194, and 195 (FIG. 1), according to an embodiment. The location of the two electrical current sensors shown in FIG. 21 were used to test calibration method 1800 of FIG. 18 and current determination method 2000 of FIG. 20. Loads coupled to main electrical power conductors 193, 194, and 195 (FIG. 1) were randomly switched on and off. While randomly switching on and off the loads, the actual current was monitored using a current monitor. The predicted currents were also calculated using methods 1800 and 2000 of FIGS. 18 and 20 after measurements were taken with the two electrical current sensors. FIG. 22 illustrates a graph comparing the currents predicted by the methods of FIGS. 18 and 20 compared to the measured currents. As shown in FIG. 22, the predicted currents closely mirror the measured currents.

Figure 23:
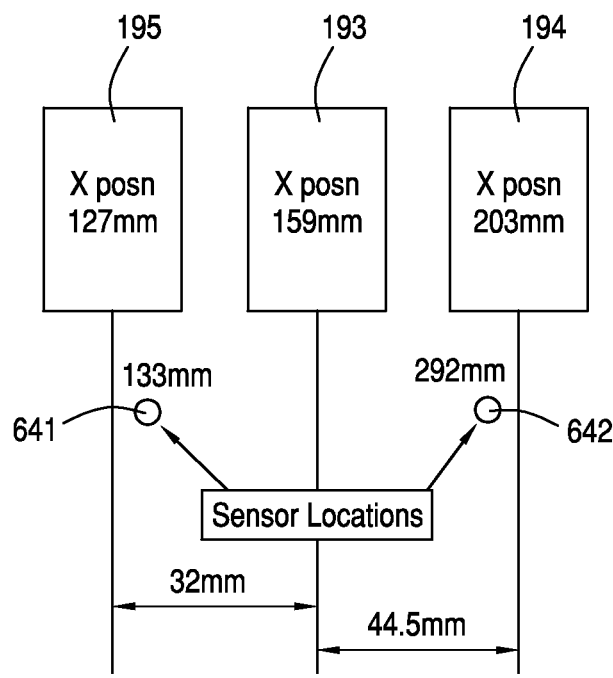
FIG. 23 illustrates an example of a second location of two electrical current sensors relative to the main electrical power conductors in an exemplary sensing device, according to an embodiment.
Figure 24:
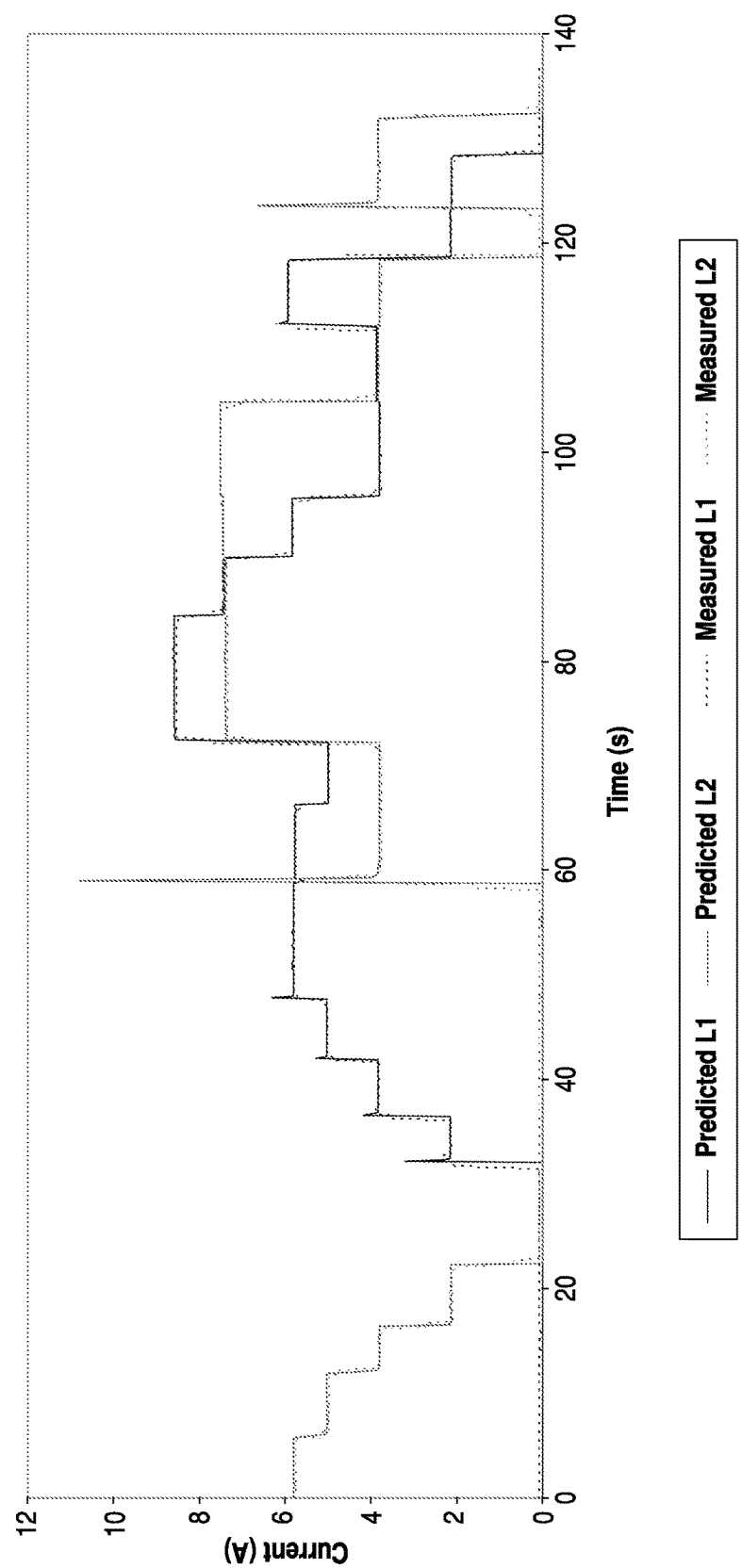
FIG. 24 illustrates a graph comparing a predicted current compared to the measured currents for the electrical current sensors of FIG. 23.

FIG. 23 illustrates an example of a second location of two electrical current sensors relative to main electrical power conductors 193, 194, and 195 (FIG. 1), according to an embodiment. The location of the two electrical current sensors shown in FIG. 23 were used to also test calibration method 1800 of FIG. 18 and current determination method 2000 of FIG. 20. Loads coupled to main electrical power conductors 193, 194, and 195 (FIG. 1) were randomly switched on and off. While randomly switching on and off the loads, the actual current was monitored using a current monitor. The predicted currents were also calculated using methods 1800 and 2000 after measurements were taken with the two electrical current sensors. FIG. 24 illustrates a graph comparing the currents predicted by the methods of FIGS. 18 and 20 compared to the measured currents. As shown in FIG. 24, the predicted currents closely mirror the measured currents.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that activities 1860, 1861, 1862, 1863, 1864, 1865, 1866, 1867, and 1868 of FIG. 18, procedures 1971, 1972, 1973, 1974, 1975, 1976, and 1977 of FIG. 17, and activities 2061, 2062, 2063, 2064, and 2065 of FIG. 20 may be comprised of many different activities, procedures and be performed by many different modules, in many different orders that any element of FIG. 1 may be modified and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of calibrating a magnetic field sensor device, the magnetic field sensor device coupled to a first surface of a circuit breaker box, the circuit breaker box overlying at least part of an electrical power infrastructure of a building, the electrical power infrastructure having one or more main electrical supply conductors, a first phase branch, and a second phase branch, the magnetic field sensor device comprising two or more magnetic field sensors, the method comprising:

determining via the magnetic field sensor device a first amplitude and a first phase angle of a first magnetic field in the two or more magnetic field sensors of the magnetic field sensor device while the magnetic field sensor device is coupled to the first surface of the circuit breaker box;

after a first load has been coupled to the first phase branch of the electrical power infrastructure, determining via the magnetic field sensor device, a second amplitude and a second phase angle of a second magnetic field in the two or more magnetic field sensors of the magnetic field sensor device while the magnetic field sensor device is coupled to the first surface of the circuit breaker box and while the first load is coupled to the first phase branch;

after the first load has been uncoupled from the first phase branch of the electrical power infrastructure and a second load has been coupled to the second phase branch of the electrical power infrastructure, determining via the magnetic field sensor device, a third amplitude and a third phase angle of a third magnetic field in the two or more magnetic field sensors of the magnetic field sensor device while the magnetic field sensor device is coupled to the first surface of the circuit breaker box and while the second load is coupled to the second phase branch; and determining via a computer processor one or more calibration coefficients for the magnetic field sensor device at least in part using the first amplitude and the first phase angle of the first magnetic field in the two or more magnetic field sensors, the second amplitude and the second phase angle of the second magnetic field in the two or more magnetic field sensors, and the third amplitude and the third phase angle of the third magnetic field in the two or more magnetic field sensors, wherein:

the magnetic field sensor device is not electrically coupled in series with or physically coupled directly to the one or more main electrical supply conductors at the circuit breaker box when the magnetic field sensor device is coupled to the first surface of the circuit breaker box.

2. The method of claim 1 further comprising:

after the first load has been uncoupled from the first phase branch of the electrical power infrastructure and a second load has been uncoupled to the second phase branch of the electrical power infrastructure, determining via the magnetic field sensor device a fourth amplitude and a fourth phase angle of a fourth magnetic field in the two or more magnetic field sensors of the magnetic field sensor device while the magnetic field sensor device is coupled to the first surface of the circuit breaker box; and determining if the fourth amplitude and the fourth phase angle of the fourth magnetic field in the two or more magnetic field sensors is within a predetermined amount of the first amplitude and the first phase angle of the first magnetic field in the two or more magnetic field sensors.

3. The method of claim 1, wherein determining via the computer processor the one or more calibration coefficients for the magnetic field sensor device comprises:

determining, for each of the two or more magnetic field sensors, first branch calibration coefficients for the first phase branch;

determining, for each of the two or more magnetic field sensors, second branch calibration coefficients for the second phase branch;

determining, for each of the two or more magnetic field sensors, a comparison of at least a portion of the first branch calibration coefficients and at least a portion of the second branch calibration coefficients;

determining a statistical mode for remaining sensors each selected from the two or more magnetic field sensors in which, for each of the remaining sensors, the comparison of at least a portion of the first branch calibration coefficient and at least a portion of the second branch calibration coefficient is within a predetermined tolerance; and determining a first part of the one or more calibration coefficients, a second part of the one or more calibration coefficients, and a third part of the one or more calibration coefficients based at least in part on the first branch calibration coefficients and the second branch calibration coefficients of the remaining sensors.

4. The method claim 1, wherein:

the magnetic field sensor device further comprises a phase detector electrically coupled to outputs of the two or more magnetic field sensors; and the phase detector is configured to determine when a first signal phase angle of a first signal in a first magnetic field sensor of the two or more magnetic field sensors is approximately 180 degrees out of phase with a second signal phase angle of a second signal in a second magnetic field sensor of the two or more magnetic field sensors.

5. A magnetic field sensing device comprising:

two or more magnetic field sensors configured to detect a magnetic field produced by an alternating current power signal in a current carrying conductor, each of the two or more magnetic field sensors being configured to output a different signal detected from the magnetic field produced by the alternating current power signal in the current carrying conductor due to different positions of each of the two or more magnetic field sensors relative to the current carrying conductor;

a phase detector electrically coupled to outputs of the two or more magnetic field sensors; and a phase indicator electrically coupled to the phase detector, wherein:

the phase indicator comprises a display that indicates, based on phase angles of the different signals detected by the two or more magnetic field sensors from the magnetic field produced by the alternating current power signal in the current carrying conductor, when the two or more magnetic field sensors are in a predefined position in relation to the current carrying conductor.

6. The magnetic field sensing device of claim 5, wherein:
a first magnetic field sensor of the two or more magnetic field sensors is configured to output a first signal detected by from the magnetic field at the position of the first magnetic field sensor produced by the alternating current power signal in the current carrying conductor;
a second magnetic field sensor of the two or more magnetic field sensors is configured to output a second signal detected by from the magnetic field at the position of the second magnetic field sensor produced by the alternating current power signal in the current carrying conductor; and
the phase detector is configured to determine when a first signal phase angle of the first signal output by the first magnetic field sensor of the two or more magnetic field sensors is approximately 180 degrees out of phase with a second signal phase angle of the second signal output by the second magnetic field sensor of the two or more magnetic field sensors.

7. The magnetic field sensing device of claim 5, wherein:
the two or more magnetic field sensors comprise:
a linear array of magnetic field sensors;
one or more multiplexers electrically coupled to the linear array of magnetic field sensors; and
a processor electrically coupled to the one or more multiplexers and configured to control the one or more multiplexers.

8. The magnetic field sensing device of claim 5, wherein:
the two or more magnetic field sensors comprise at least one of an inductive pickup sensor, a Hall effect sensor, or a magnetoresistive sensor.

9. The magnetic field sensing device of claim 5 further comprising:
one or more amplifiers electrically coupled to the two or more magnetic field sensors.

10. The magnetic field sensing device of claim 5 further comprising:
one or more filters electrically coupled to the two or more magnetic field sensors.

11. The magnetic field sensing device of claim 5 further comprising:
a wireless transmitter configured to transmit information regarding one or more magnetic field measurements from the two or more magnetic field sensors to a remote indicating device.

12. The magnetic field sensing device of claim 5, wherein:
each of the two or more magnetic field sensors comprises a ferromagnetic core and a sensing coil wrapped around the ferromagnetic core.

13. A method of providing a magnetic field sensing device, the method comprising:
providing two or more magnetic field sensors configured to detect a magnetic field produced by an alternating current power signal in a current carrying conductor, each of the two or more magnetic field sensors being configured to output a different signal detected from the magnetic field produced by the alternating current power signal in the current carrying conductor due to different positions of each of the two or more magnetic field sensors relative to the current carrying conductor;
providing a phase detector electrically coupled to outputs of the two or more magnetic field sensors; and
providing a phase indicator electrically coupled to the phase detector,
wherein:
the phase indicator comprises a display that indicates, based on phase angles of the different signals detected by the two or more magnetic field sensors from the magnetic field produced by the alternating current power signal in the current carrying conductor, when the two or more magnetic field sensors are in a predefined position in relation to the current carrying conductor.

14. The method of claim 13, wherein:
providing two or more magnetic field sensors comprises:
providing a first magnetic field sensor of the two or more magnetic field sensors that is configured to output a first signal detected by from the magnetic field at the position of the first magnetic field sensor produced by the alternating current power signal in the current carrying conductor;
providing a second magnetic field sensor of the two or more magnetic field sensors that is configured to output a second signal detected by from the magnetic field at the position of the second magnetic field sensor produced by the alternating current power signal in the current carrying conductor; and
providing the phase detector comprises providing the phase detector configured to determine when a first signal phase angle of the first signal output by the first magnetic field sensor of the two or more magnetic field sensors is approximately 180 degrees out of phase with a second signal phase angle of the second signal output by the second magnetic field sensor of the two or more magnetic field sensors.

15. The method of claim 13, wherein:
providing the two or more magnetic field sensors comprises providing the two or more magnetic field sensors to comprise:
a linear array of magnetic field sensors;
one or more multiplexers electrically coupled to the linear array of magnetic field sensors; and
a processor electrically coupled to the one or more multiplexers and configured to control the one or more multiplexers.

16. The method of claim 13, wherein:
providing the two or more magnetic field sensors comprises providing the two or more magnetic field sensors to comprise at least one of an inductive pickup sensor, a Hall effect sensor, or a magnetoresistive sensor.

17. The method of claim 13 further comprising:
providing one or more amplifiers electrically coupled to the two or more magnetic field sensors.

18. The method of claim 13 further comprising:
providing one or more filters electrically coupled to the two or more magnetic field sensors.

19. The method of claim 13 further comprising:
providing a wireless transmitter configured to transmit information regarding one or more magnetic field measurements from the two or more magnetic field sensors to a remote indicating device.

20. The method of claim 13, wherein:
providing the two or more magnetic field sensors comprises providing each of the two or more magnetic field sensors to comprise a ferromagnetic core and a sensing coil wrapped around the ferromagnetic core.

* * * * *